(12) United States Patent
Chuang et al.

(10) Patent No.: US 11,839,071 B2
(45) Date of Patent: Dec. 5, 2023

(54) VERTICAL ACCESS TRANSISTORS AND METHODS FOR FORMING THE SAME

(71) Applicant: Taiwan Semiconductor Manufacturing Company Limited, Hsinchu (TW)

(72) Inventors: Ming-Yen Chuang, Hsinchu (TW); Katherine H. Chiang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/382,597

(22) Filed: Jul. 22, 2021

(65) Prior Publication Data
US 2023/0025820 A1    Jan. 26, 2023

(51) Int. Cl.
*H10B 53/30* (2023.01)
*H01L 29/786* (2006.01)
*H01L 29/66* (2006.01)
*H01L 21/02* (2006.01)

(52) U.S. Cl.
CPC ....... *H10B 53/30* (2023.02); *H01L 21/02565* (2013.01); *H01L 29/66969* (2013.01); *H01L 29/7869* (2013.01); *H01L 29/78642* (2013.01)

(58) Field of Classification Search
None
See application file for complete search history.

(56) References Cited

U.S. PATENT DOCUMENTS

| | | | | |
|---|---|---|---|---|
| 9,276,092 B1* | 3/2016 | Karda | ................ | H01L 45/1206 |
| 9,698,272 B1* | 7/2017 | Ikeda | ................ | H01L 29/42392 |
| 10,381,376 B1* | 8/2019 | Nishikawa | .......... | H01L 27/1157 |
| 2011/0121284 A1* | 5/2011 | Yamazaki | ......... | H01L 29/78606 |
| | | | | 257/43 |
| 2012/0228615 A1* | 9/2012 | Uochi | ..................... | H01L 21/84 |
| | | | | 257/E29.273 |
| 2012/0228688 A1* | 9/2012 | Matsubayashi | ......... | H01L 28/40 |
| | | | | 257/296 |
| 2016/0197099 A1* | 7/2016 | Sasaki | ............... | H01L 29/78645 |
| | | | | 257/43 |
| 2018/0108782 A1* | 4/2018 | Zhou | ................... | H01L 21/3081 |
| 2019/0067475 A1* | 2/2019 | Liu | ......................... | H01L 21/44 |
| 2020/0111915 A1* | 4/2020 | Sills | ................... | H01L 29/1033 |
| 2021/0335820 A1* | 10/2021 | Kang | ................ | H01L 27/11587 |
| 2021/0343787 A1* | 11/2021 | Goto | .................. | H01L 27/2463 |

(Continued)

*Primary Examiner* — Vincent Wall
(74) *Attorney, Agent, or Firm* — The Marbury Law Group, PLLC

(57) ABSTRACT

A plurality of vertical stacks may be formed over a substrate. Each of the vertical stacks includes, from bottom to top, a bottom electrode, a dielectric pillar, and a top electrode. A continuous active layer may be formed over the plurality of vertical stacks. A gate dielectric layer may be formed over the continuous active layer. The continuous active layer and the gate dielectric layer may be patterned into a plurality of active layers and a plurality of gate dielectrics. Each of the plurality of active layers laterally surrounds a respective one of the vertical stacks that are arranged along a first horizontal direction, and each of the plurality of gate dielectrics laterally surrounds a respective one of the active layers. Gate electrodes may be formed over the plurality of gate dielectrics.

20 Claims, 29 Drawing Sheets

(56) References Cited

U.S. PATENT DOCUMENTS

2021/0375937 A1* 12/2021 Wu .................. H01L 27/11587
2021/0375990 A1* 12/2021 Young .................... H01L 29/24
2022/0310613 A1*  9/2022 Okajima ................. H01L 29/24

* cited by examiner

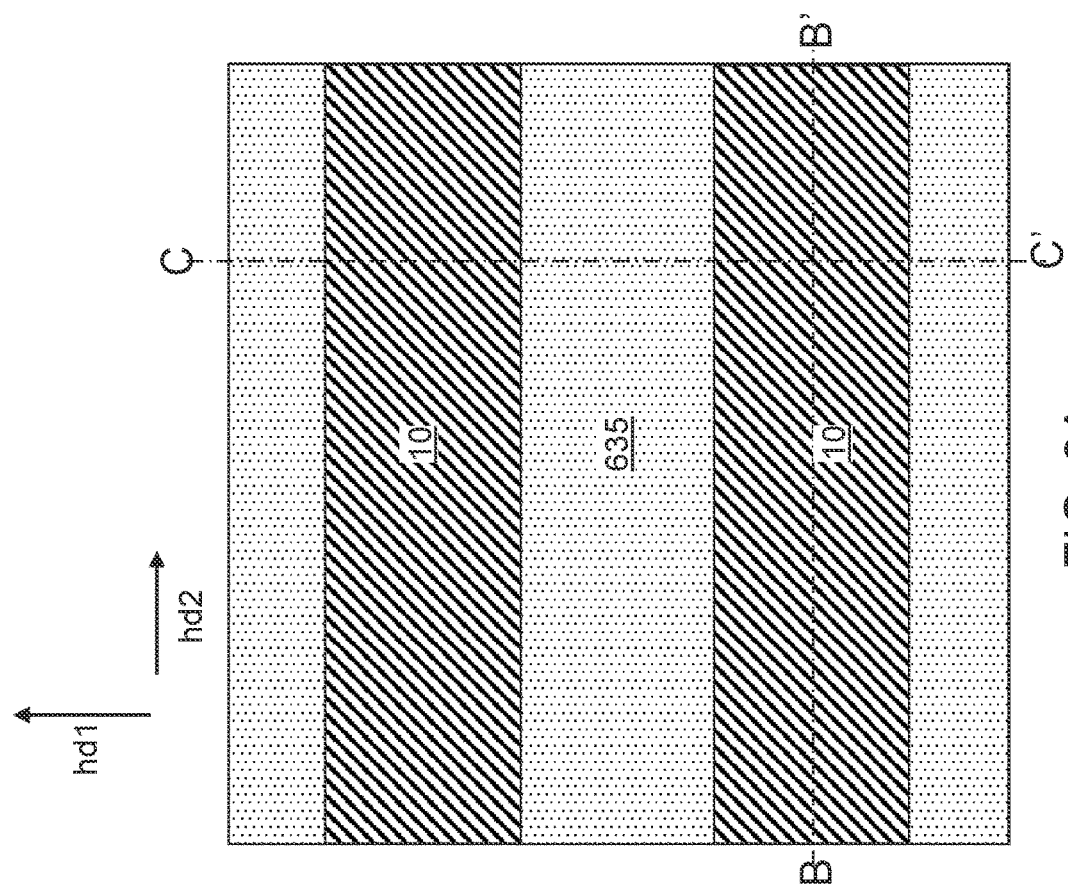
FIG. 2A
FIG. 2B
FIG. 2C

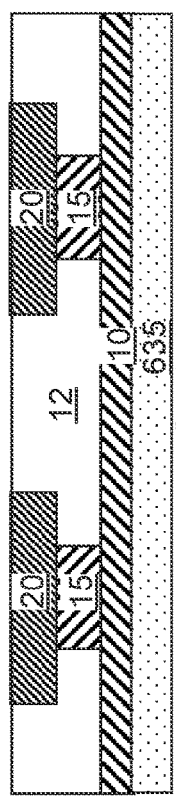
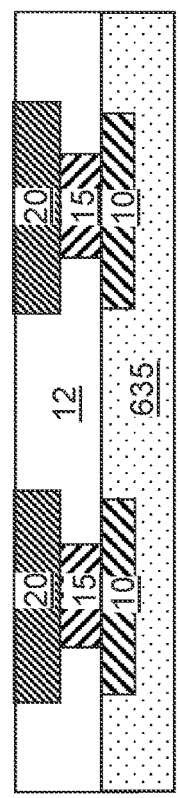
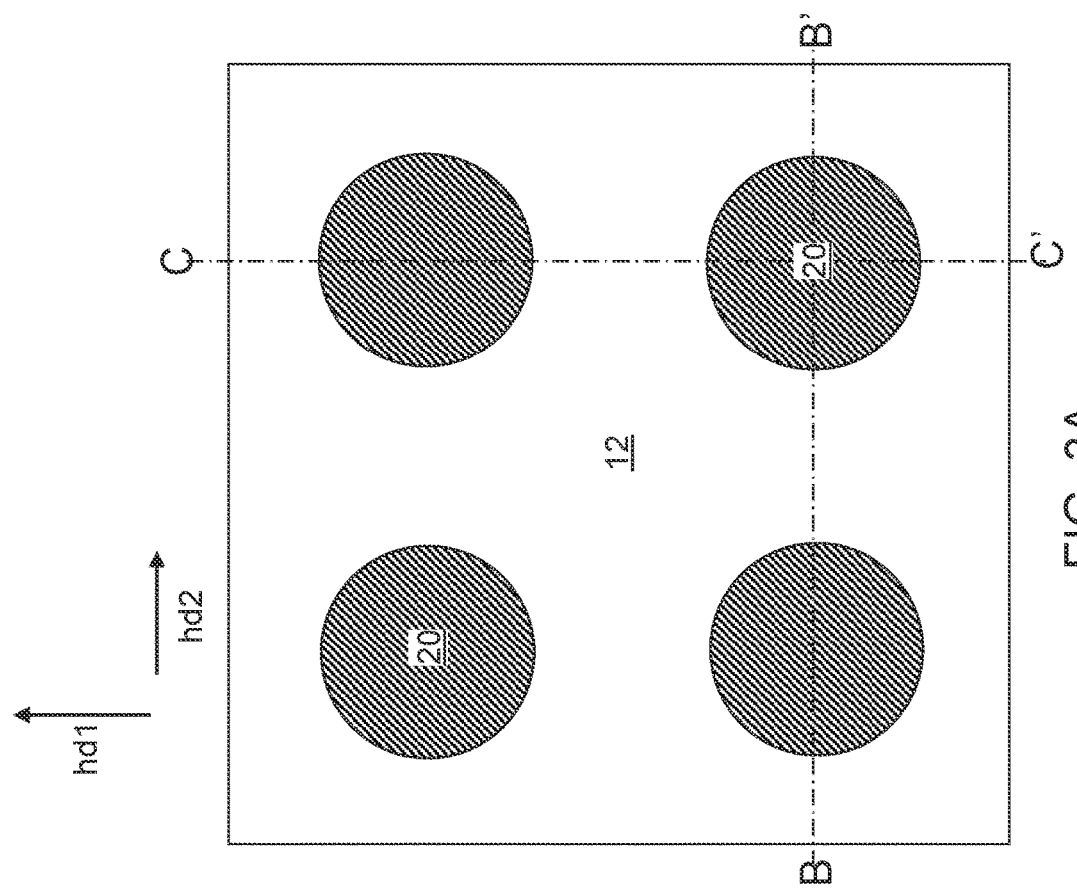
FIG. 3B
FIG. 3C
FIG. 3A

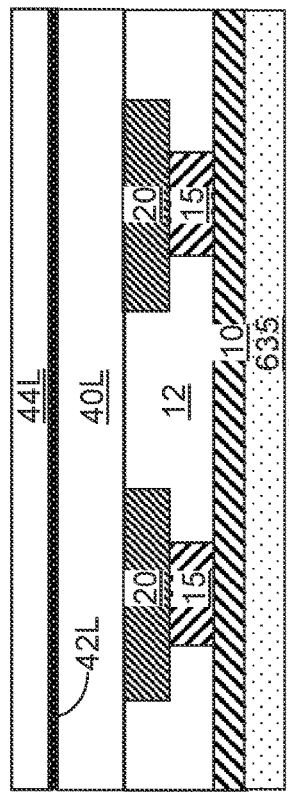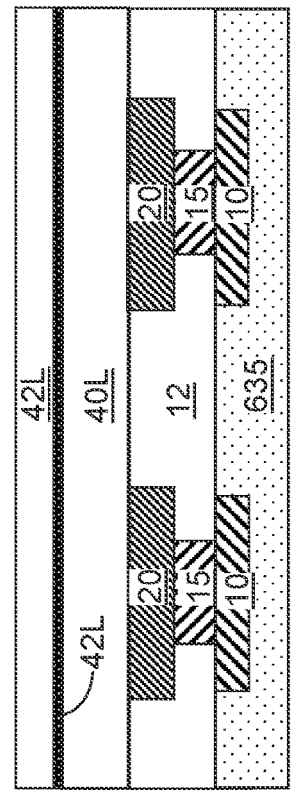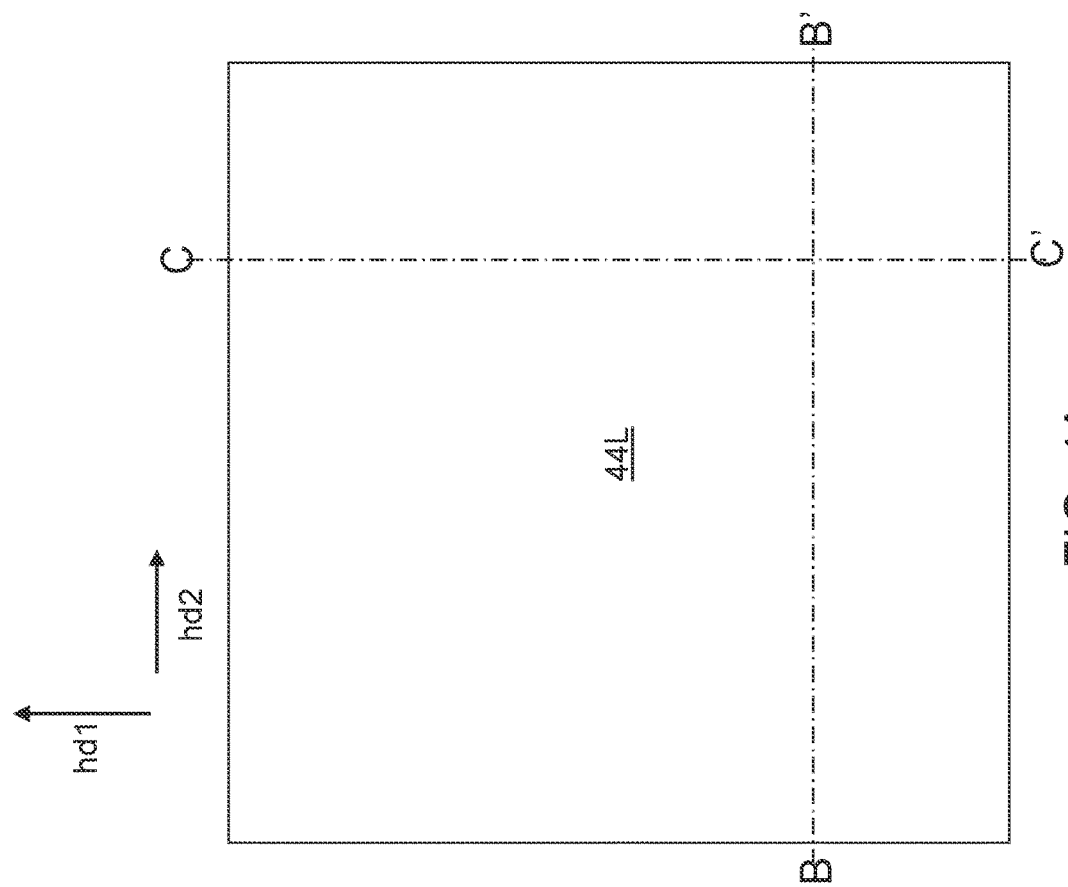

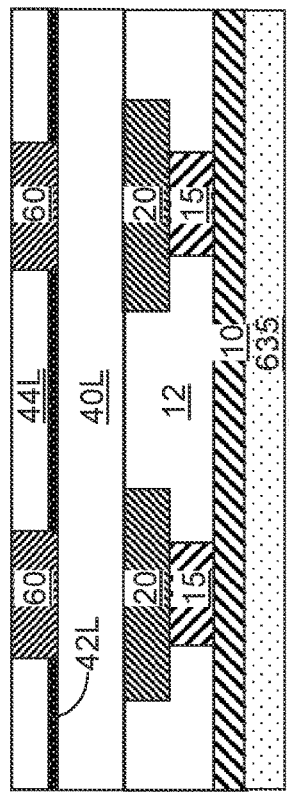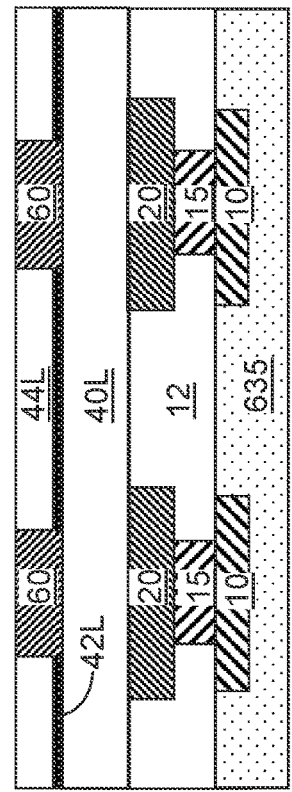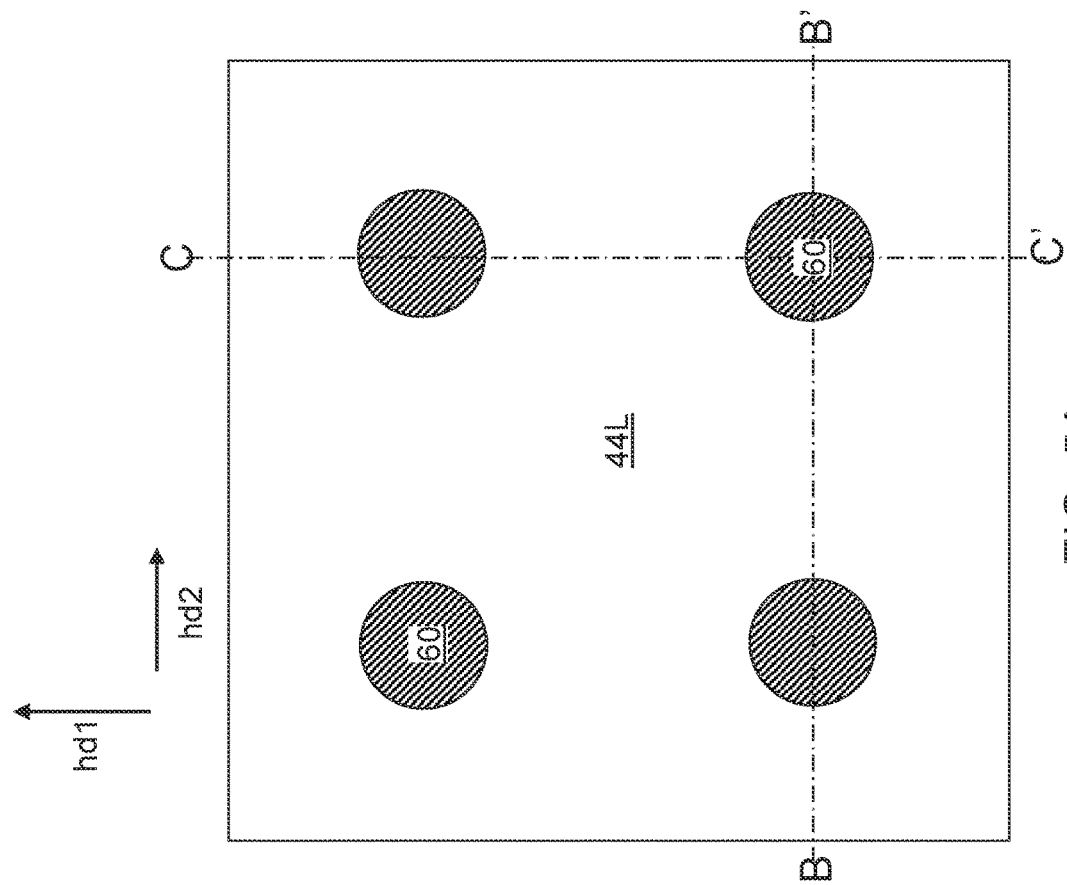

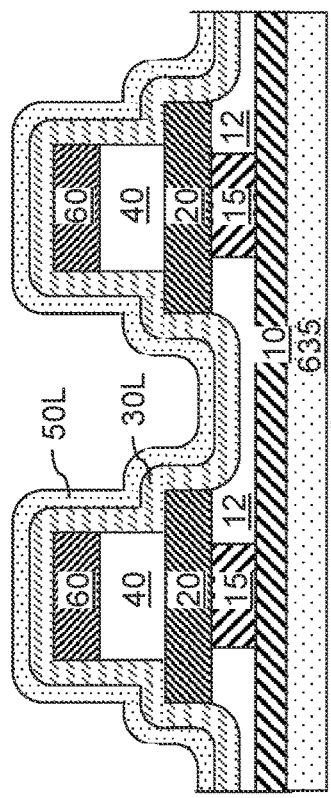
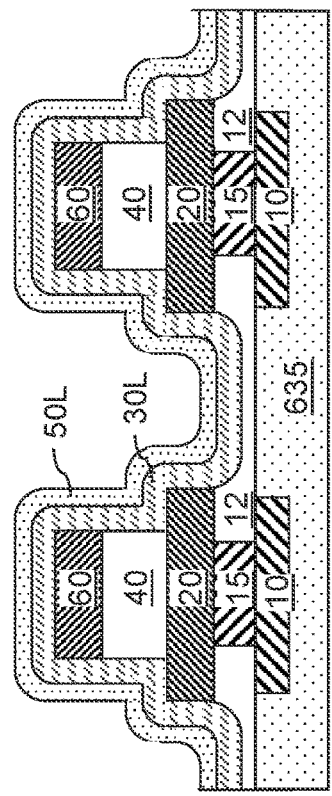
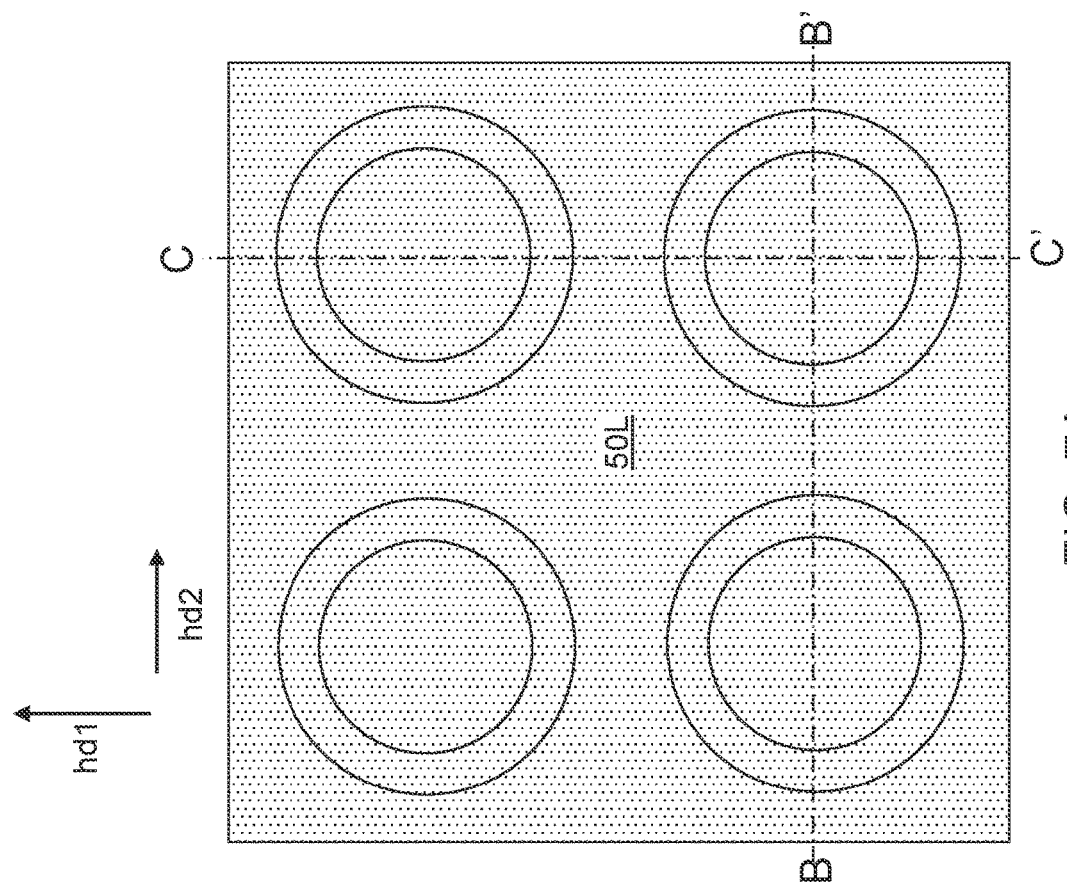
FIG. 7A

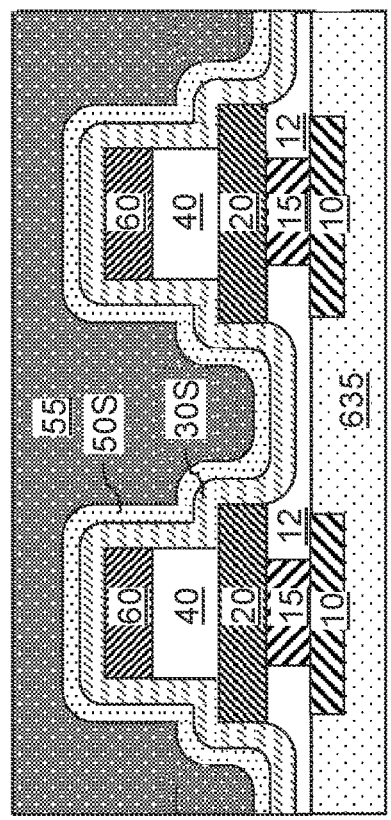
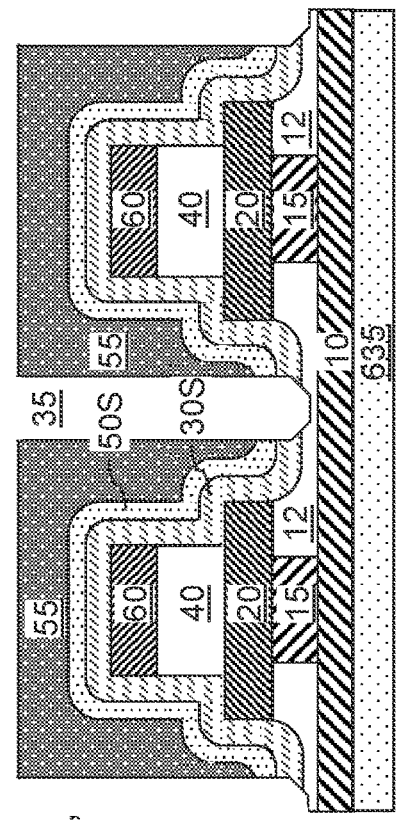
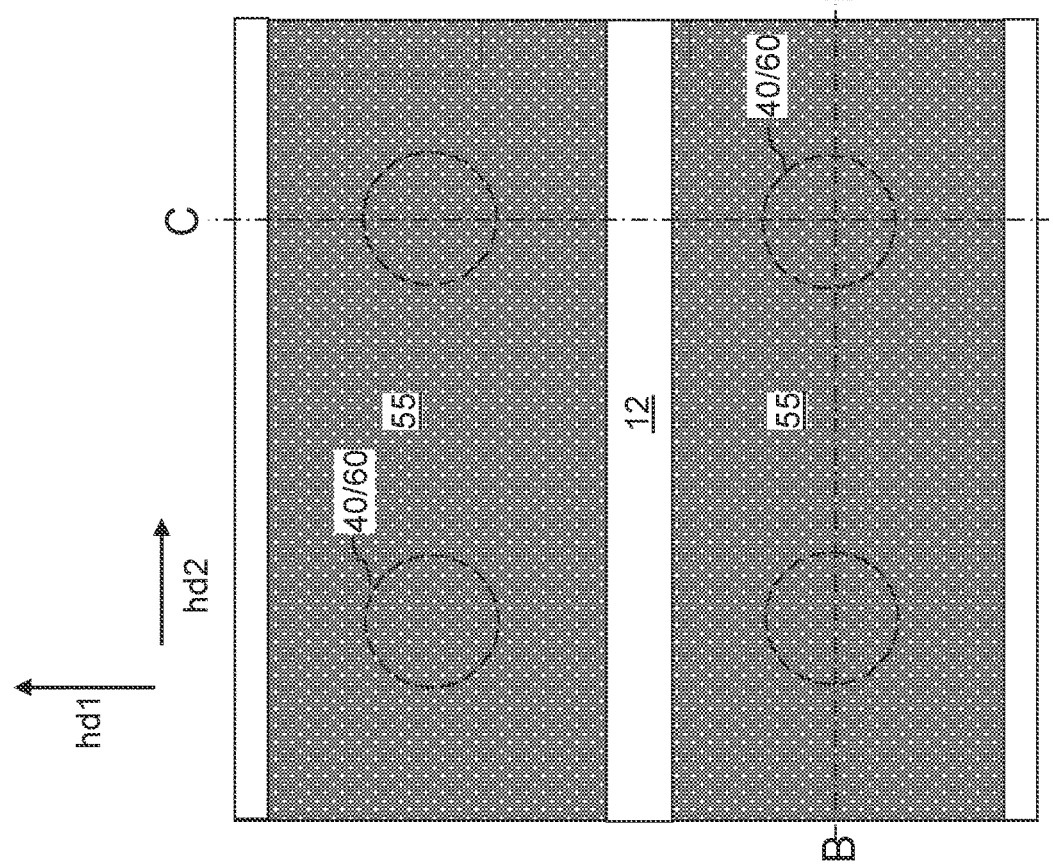

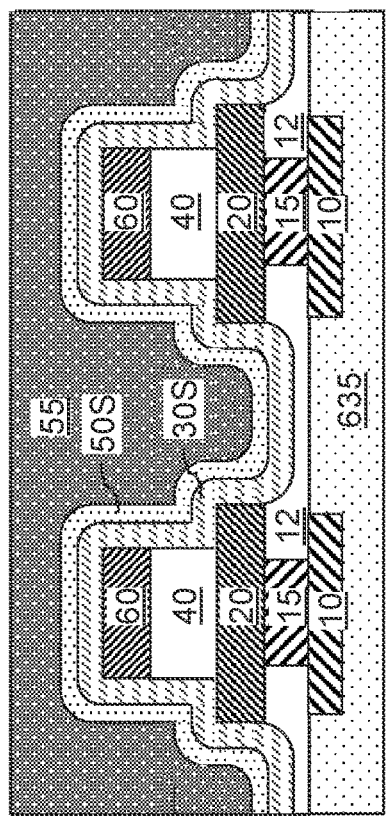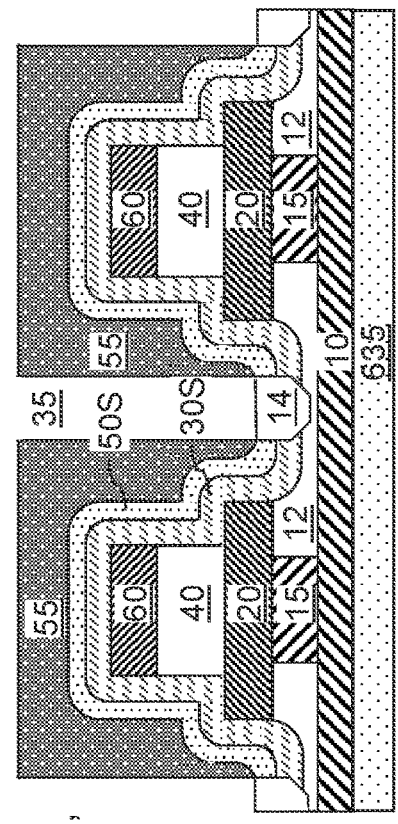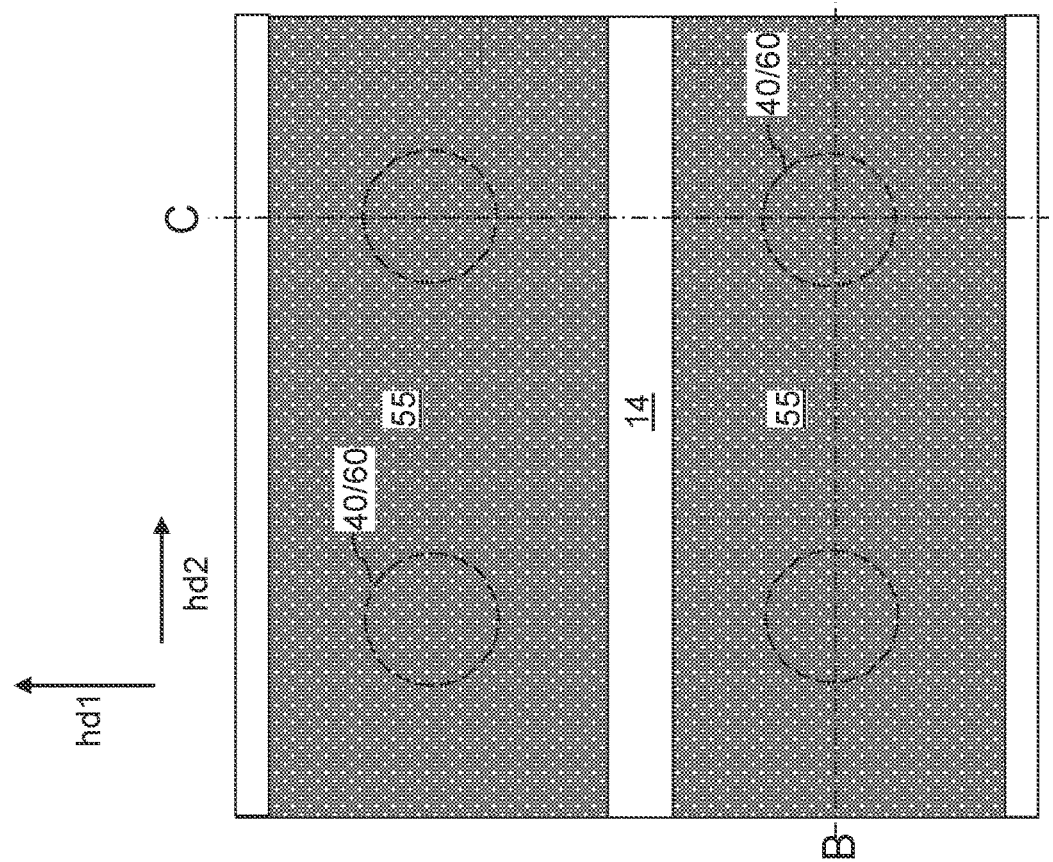
FIG. 9B
FIG. 9C
FIG. 9A

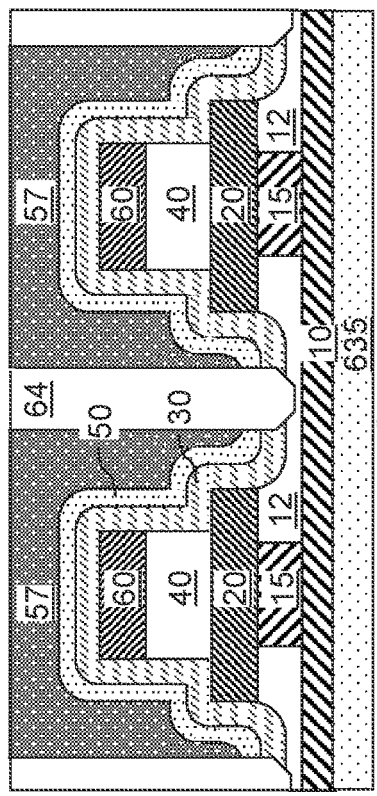
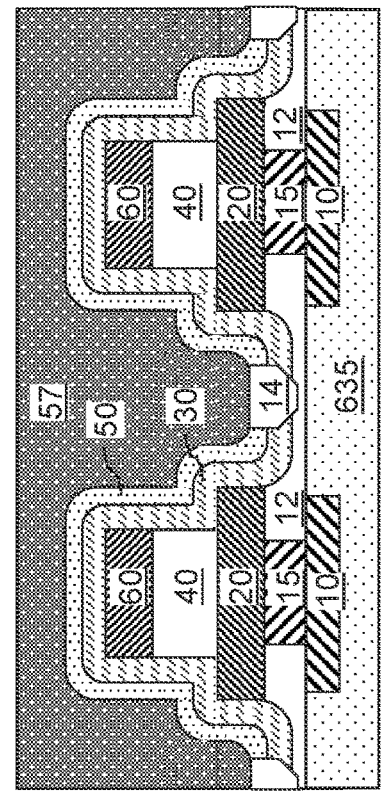
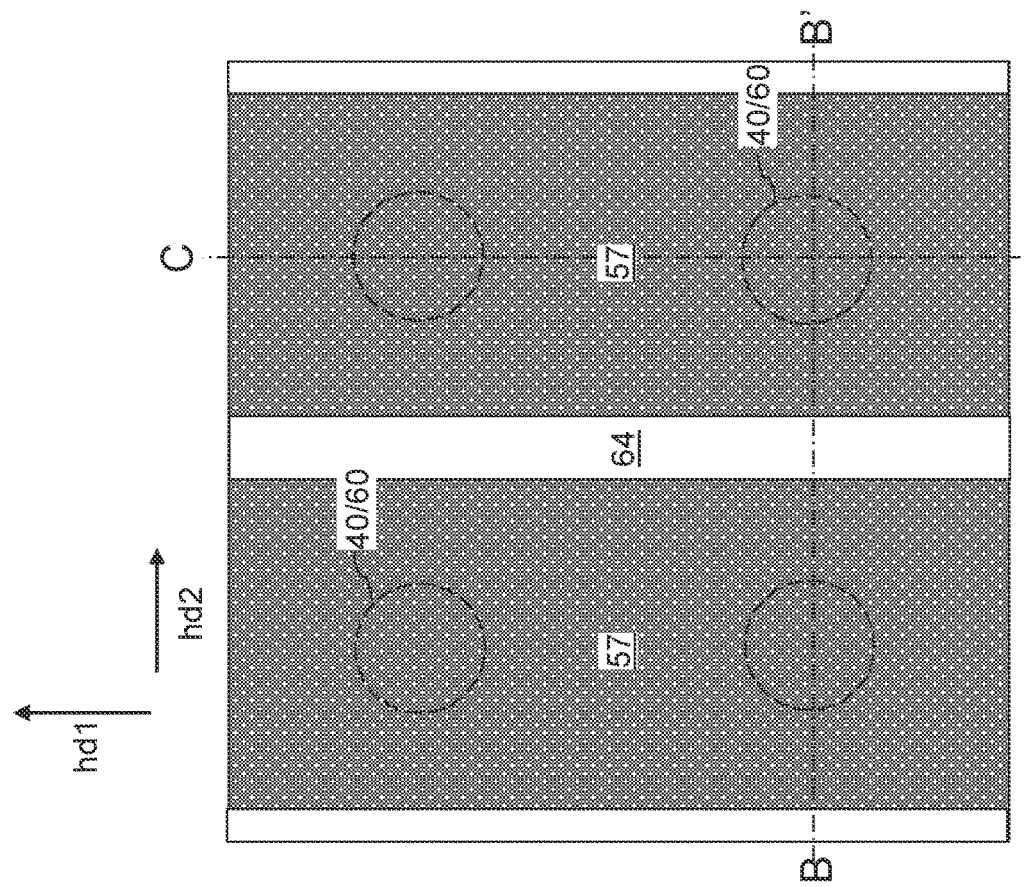
FIG. 11B
FIG. 11C
FIG. 11A

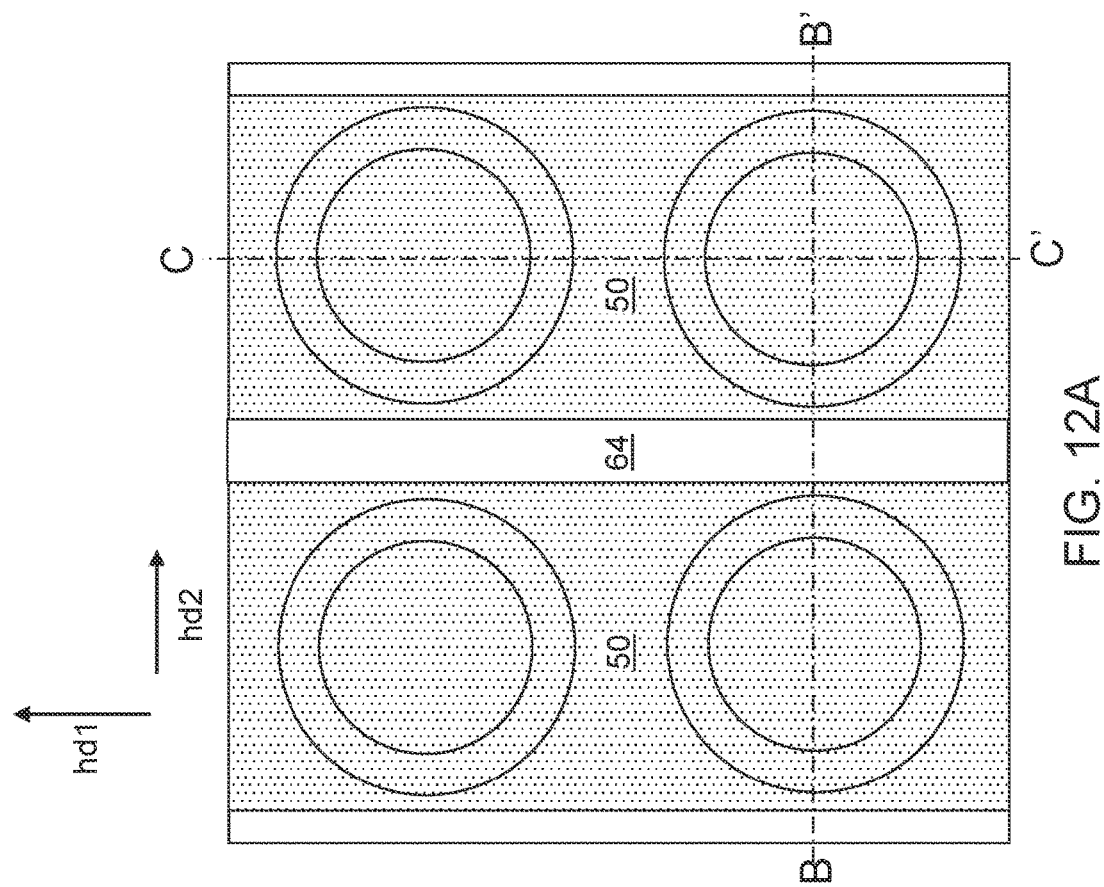
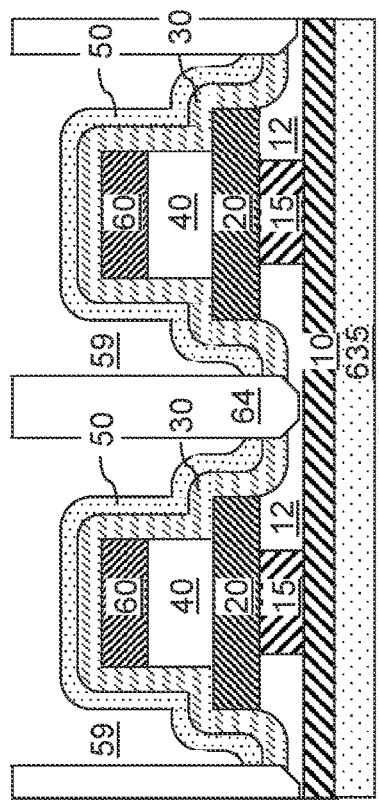
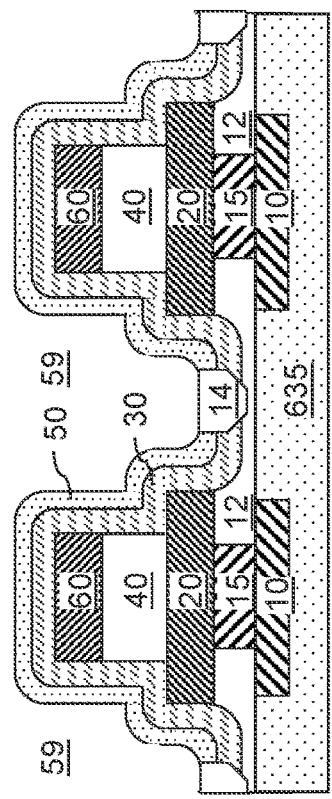
FIG. 12A
FIG. 12B
FIG. 12C

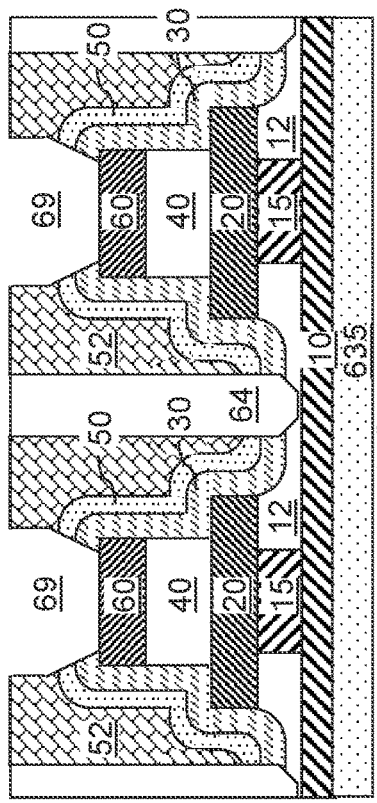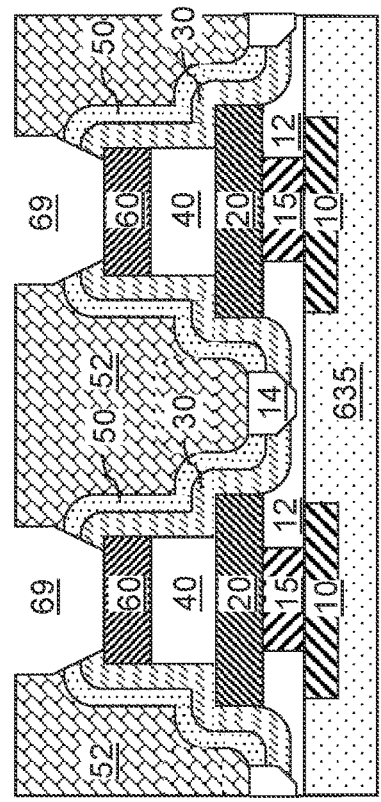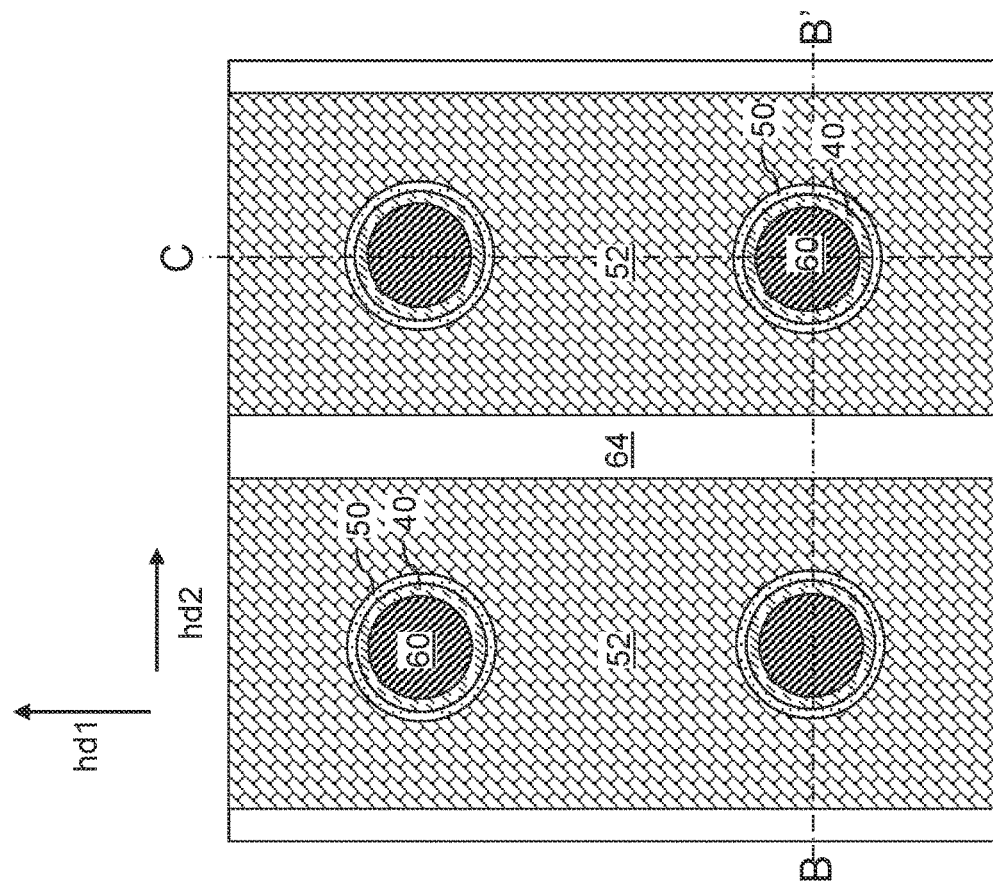

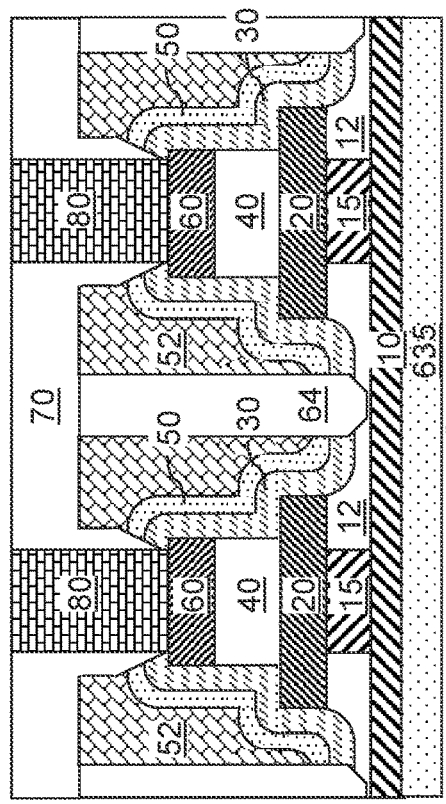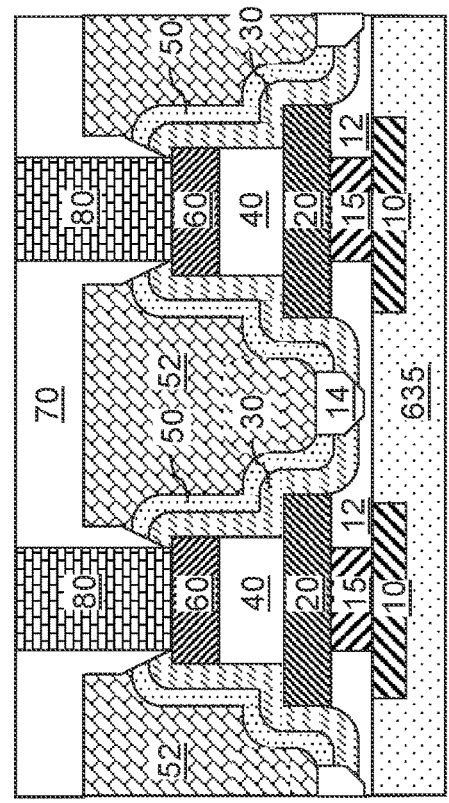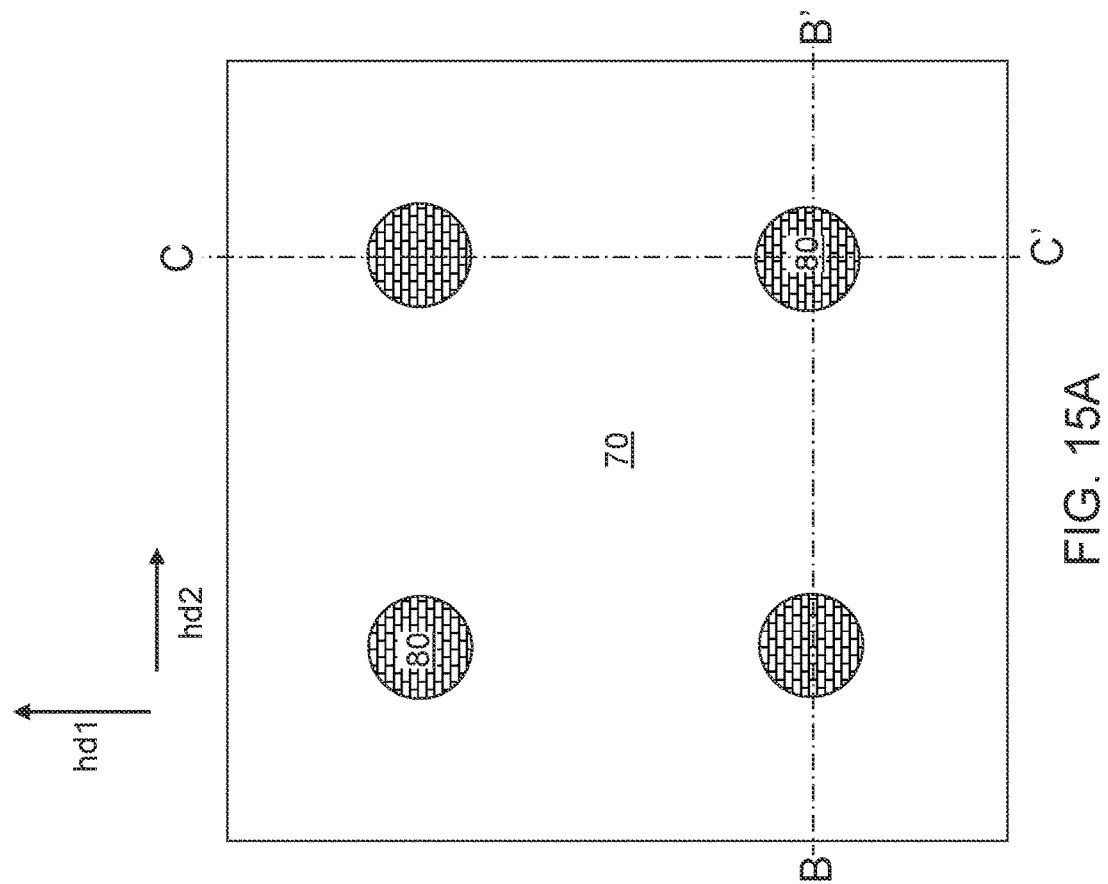

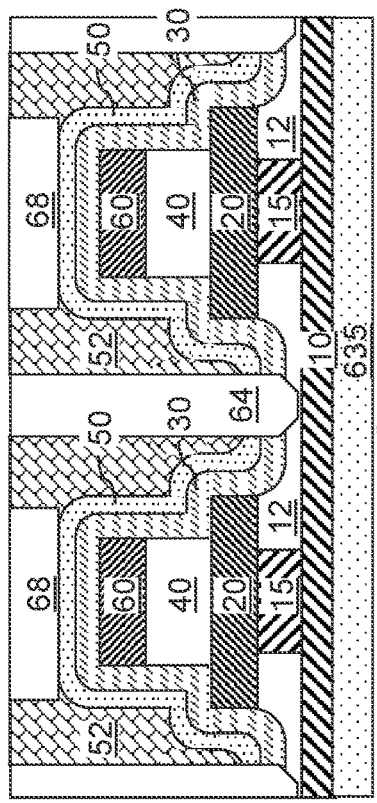
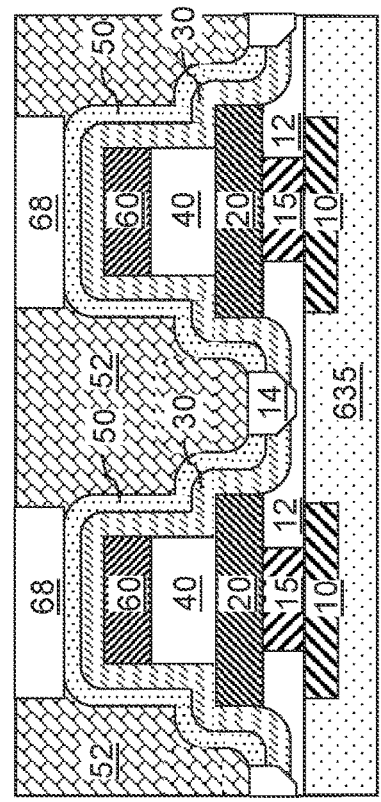
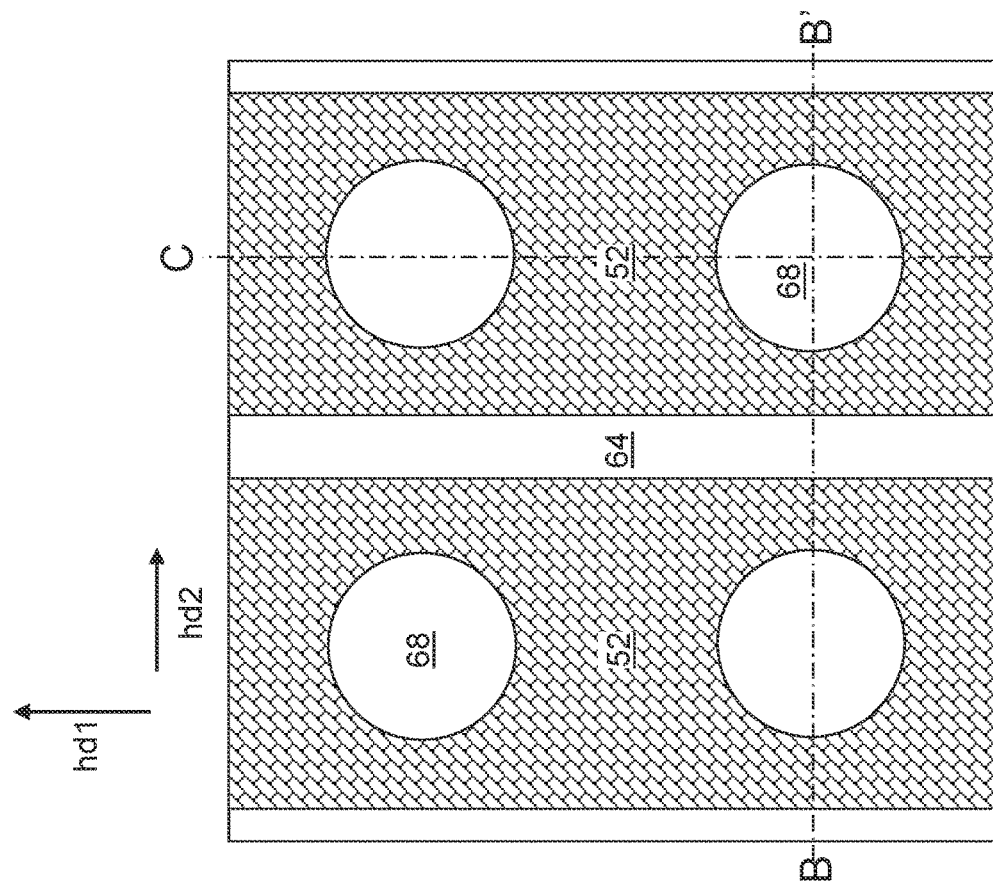
FIG. 17A
FIG. 17B
FIG. 17C

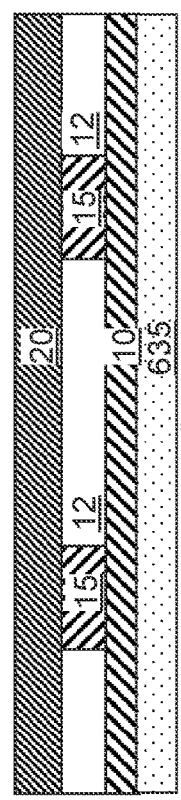 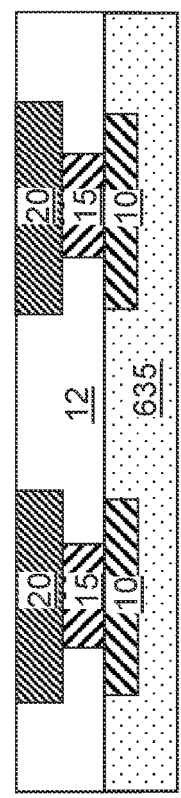 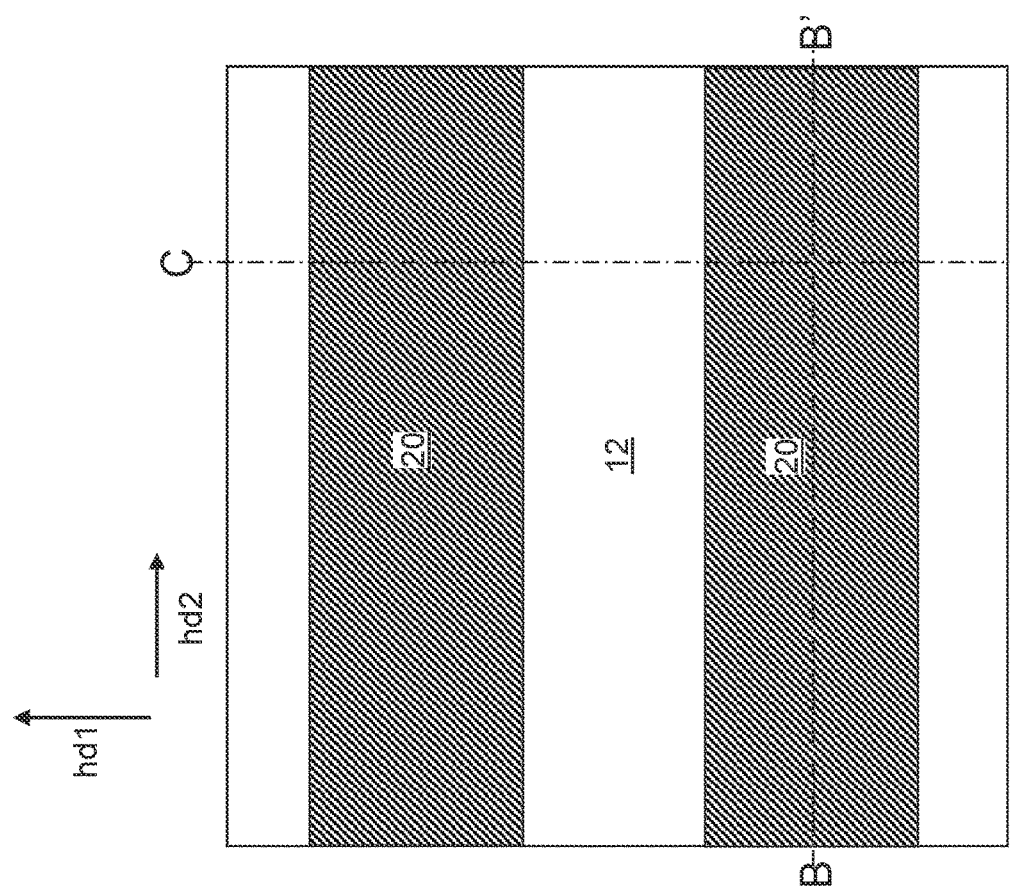

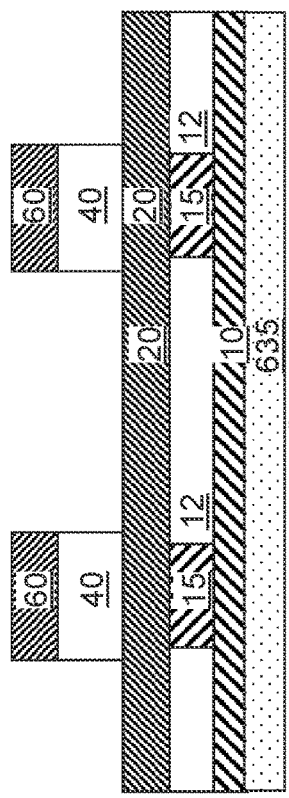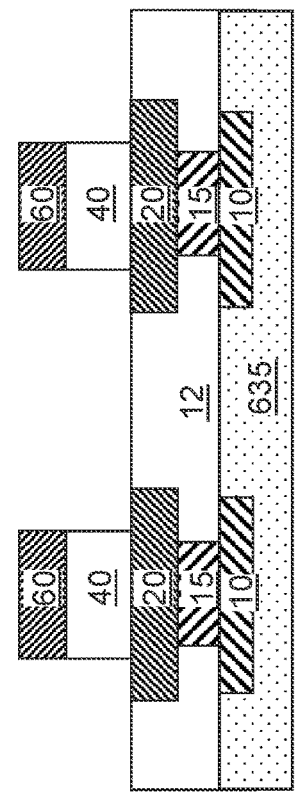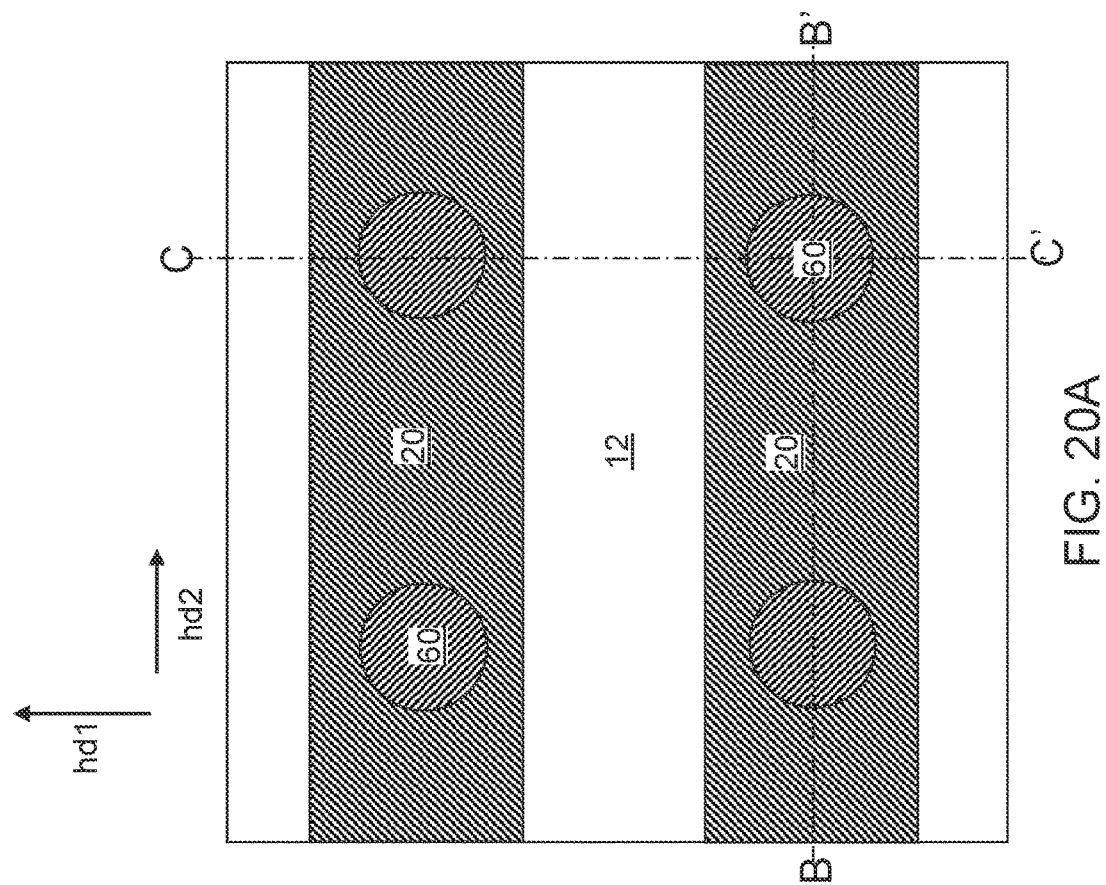

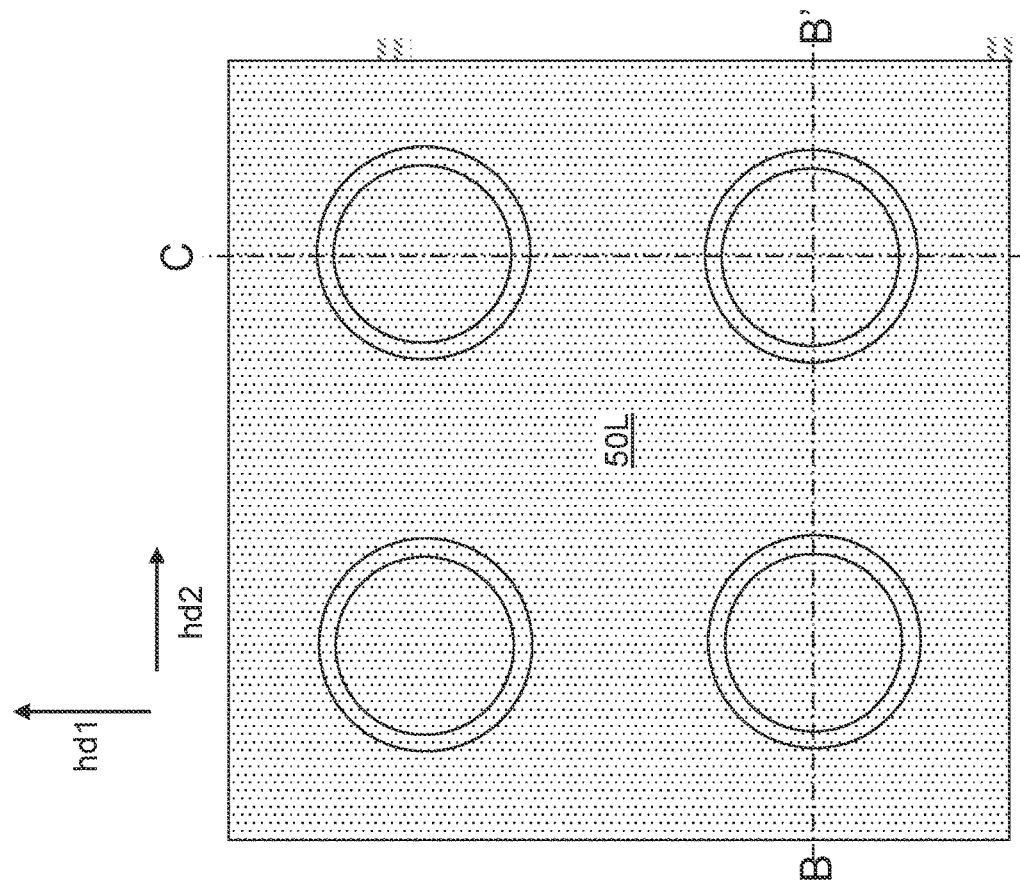
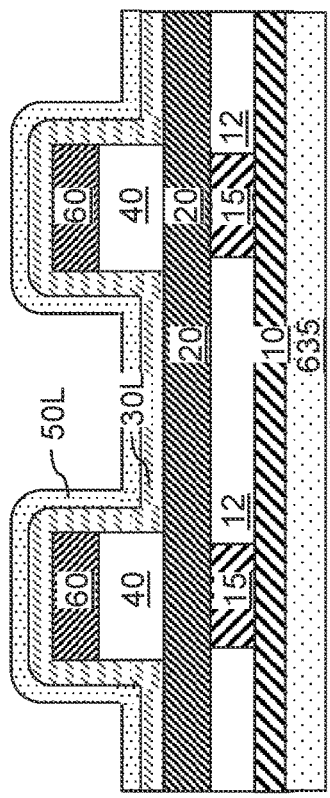
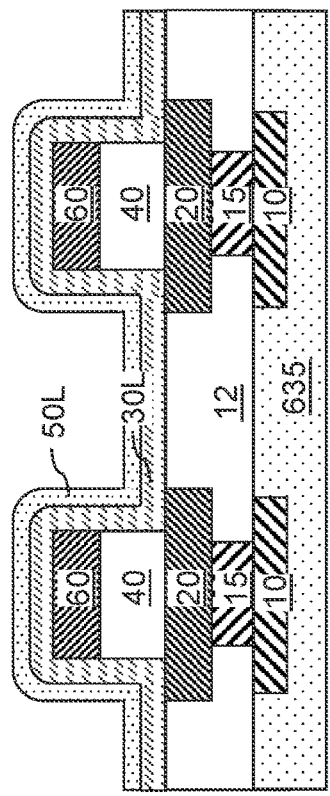
FIG. 21A
FIG. 21B
FIG. 21C

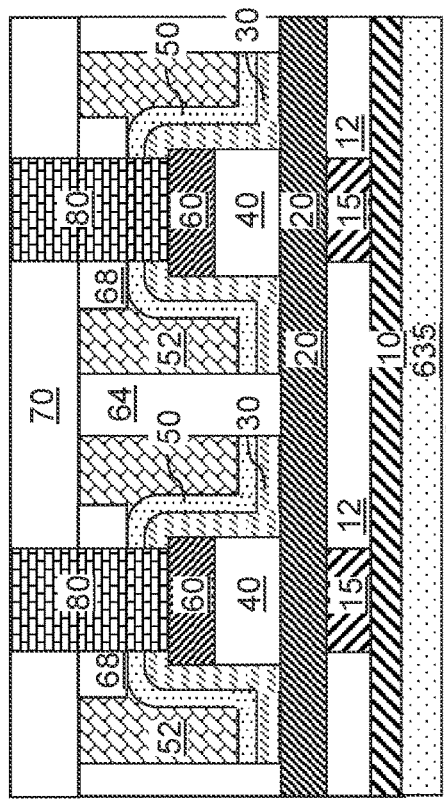
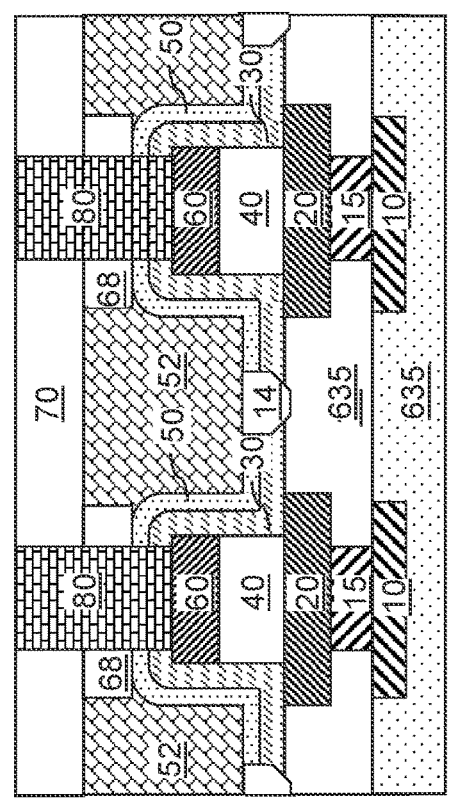
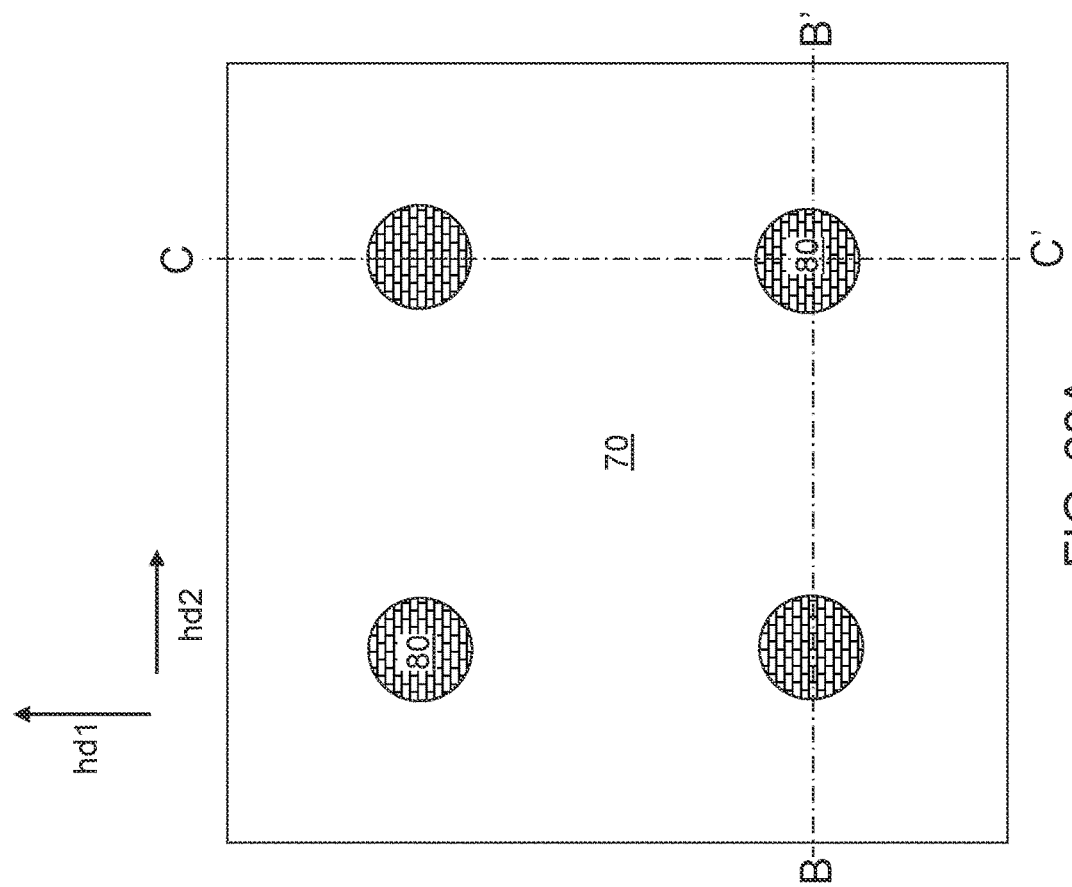
FIG. 22B
FIG. 22C
FIG. 22A

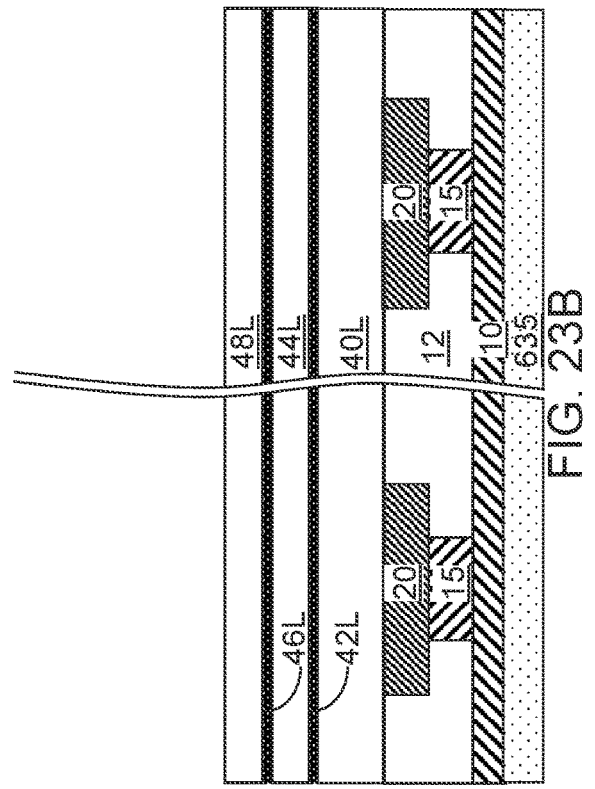
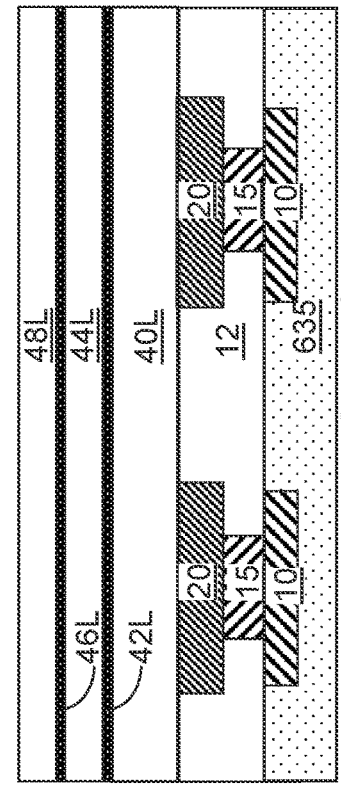
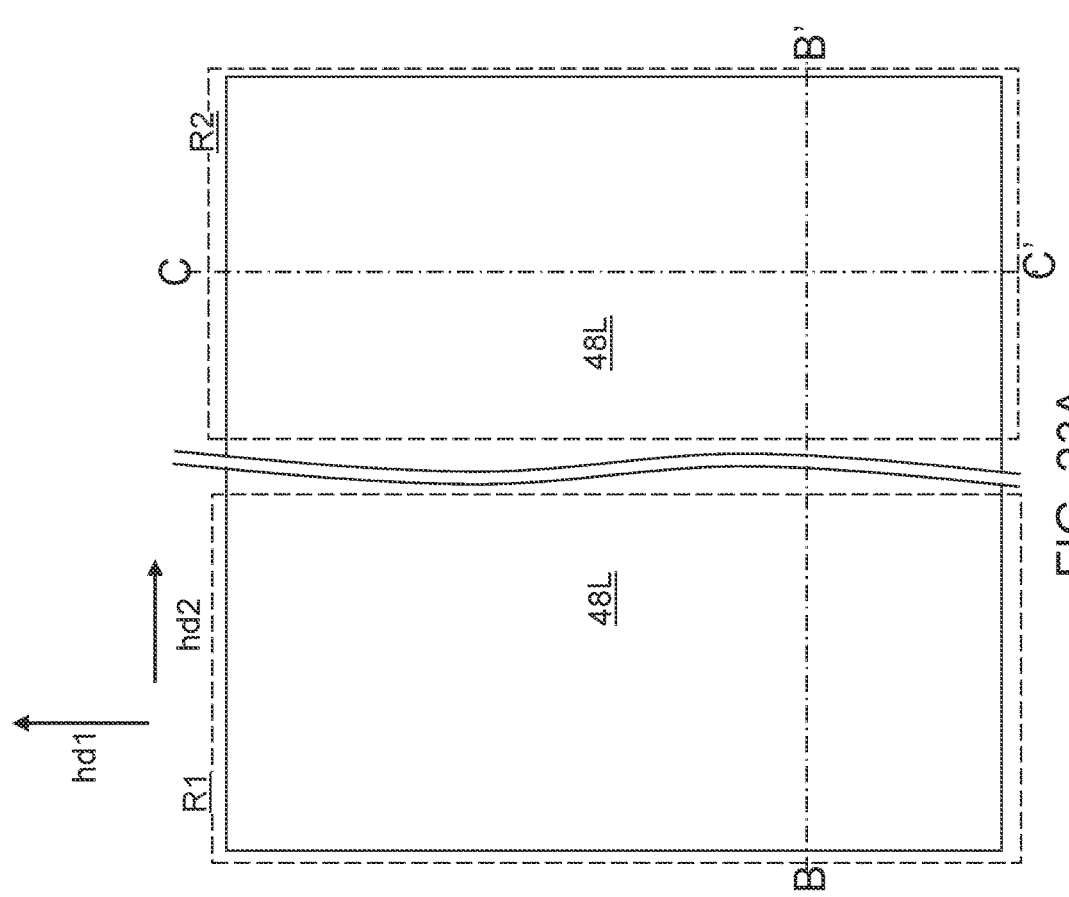
FIG. 23B
FIG. 23C
FIG. 23A

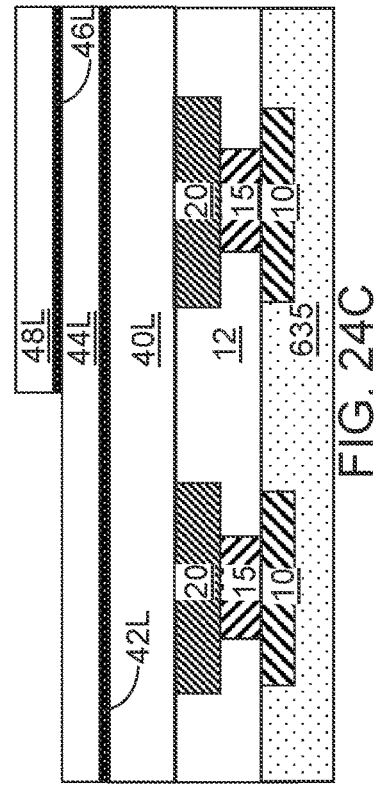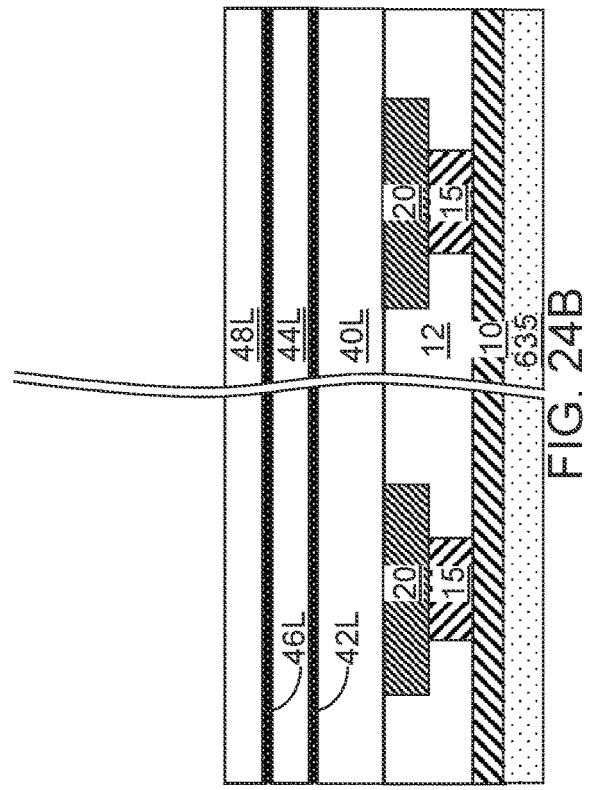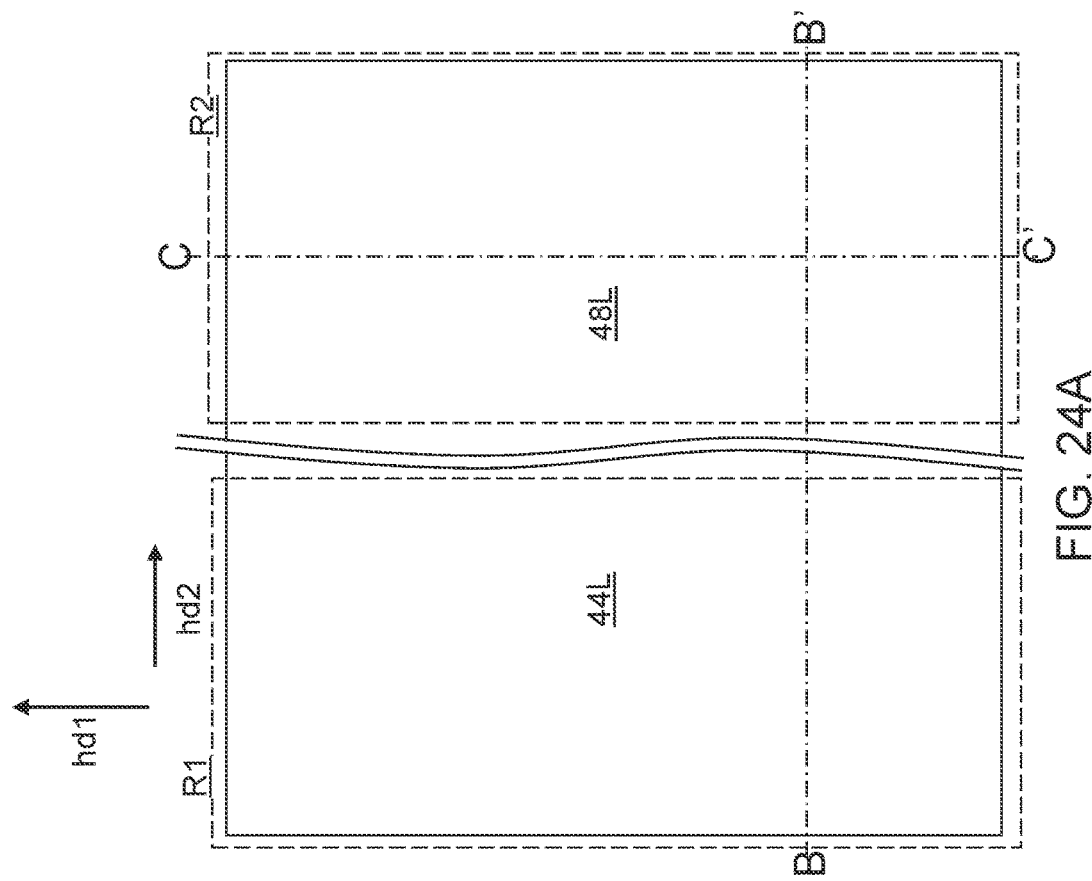

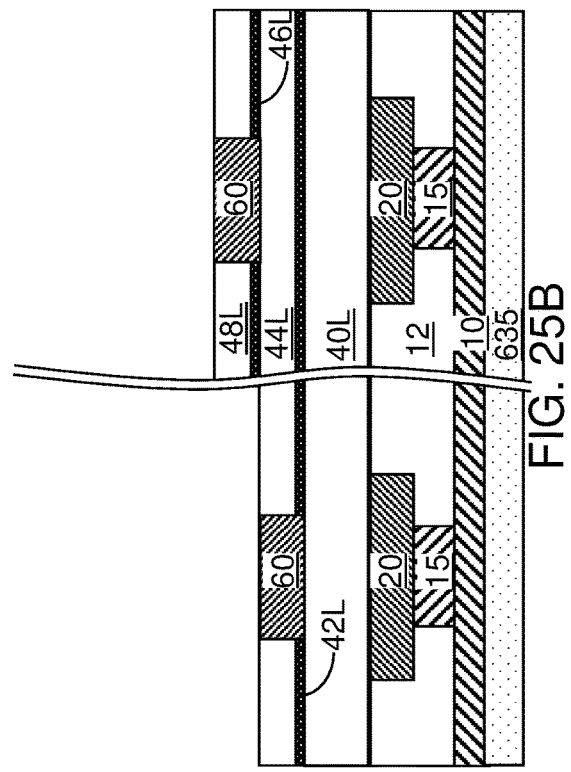
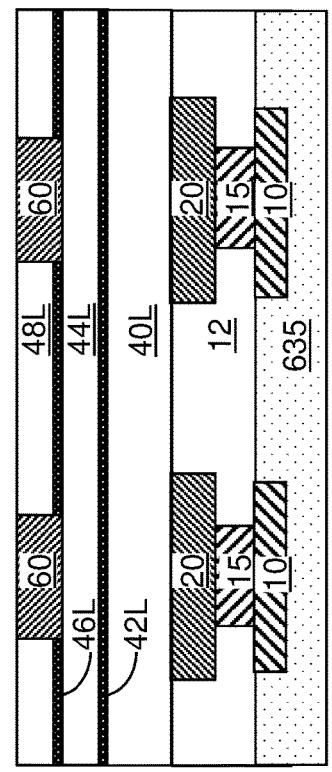
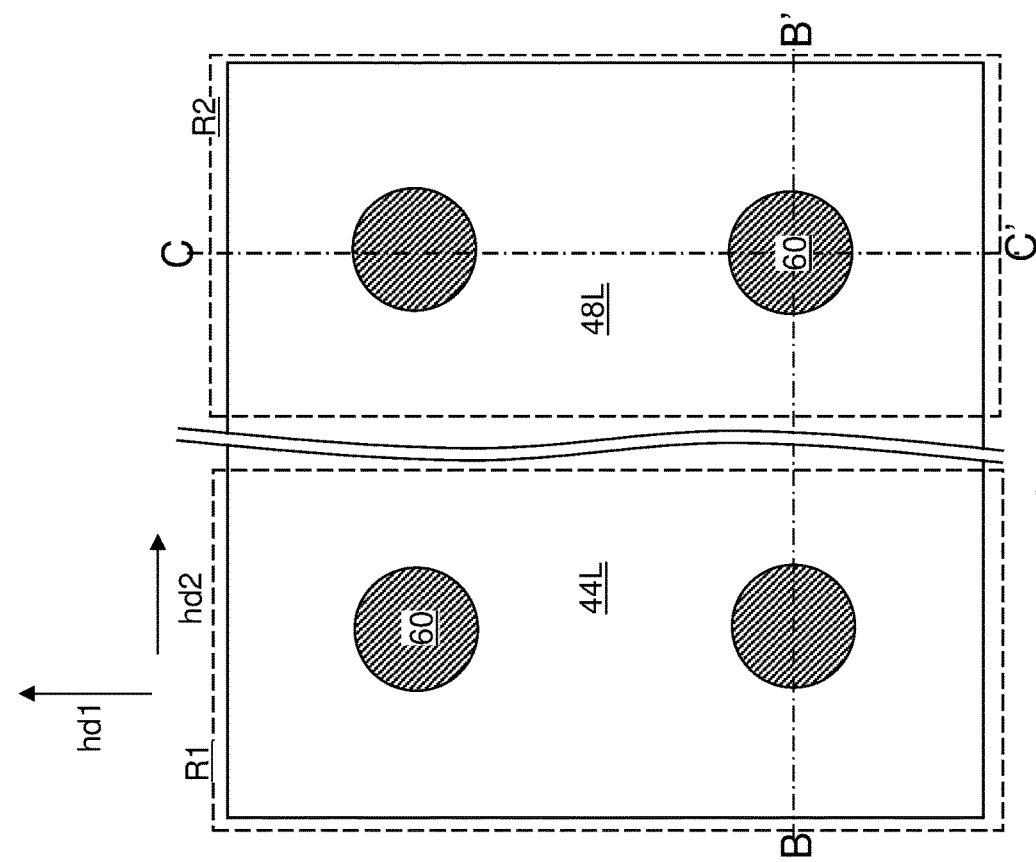
FIG. 25B
FIG. 25C
FIG. 25A

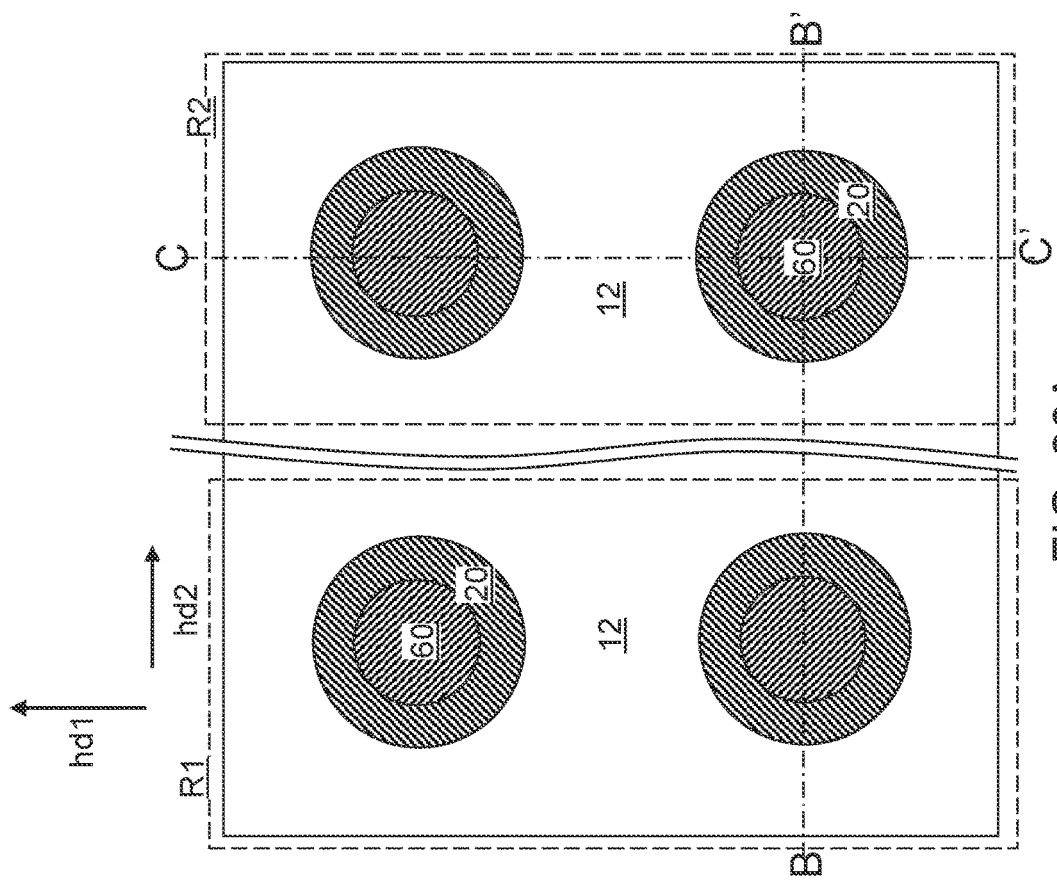
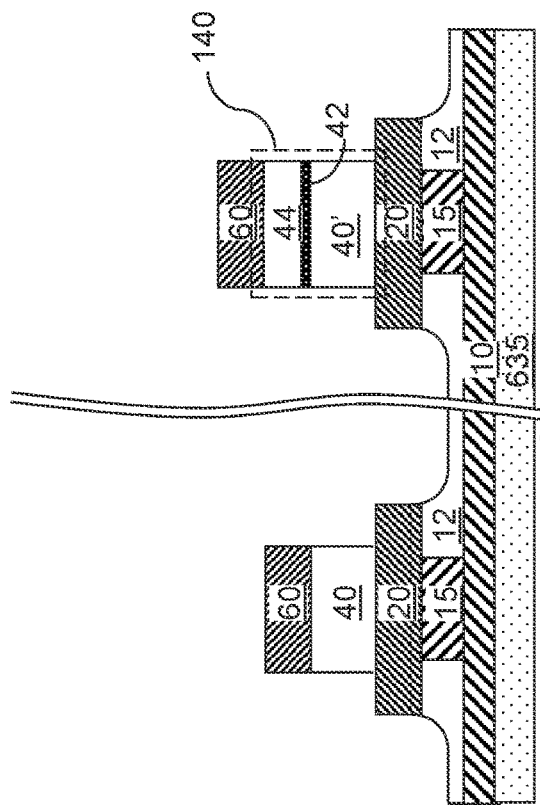
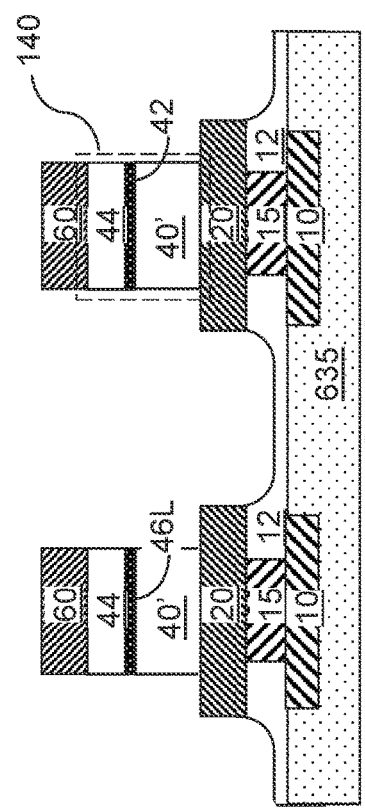

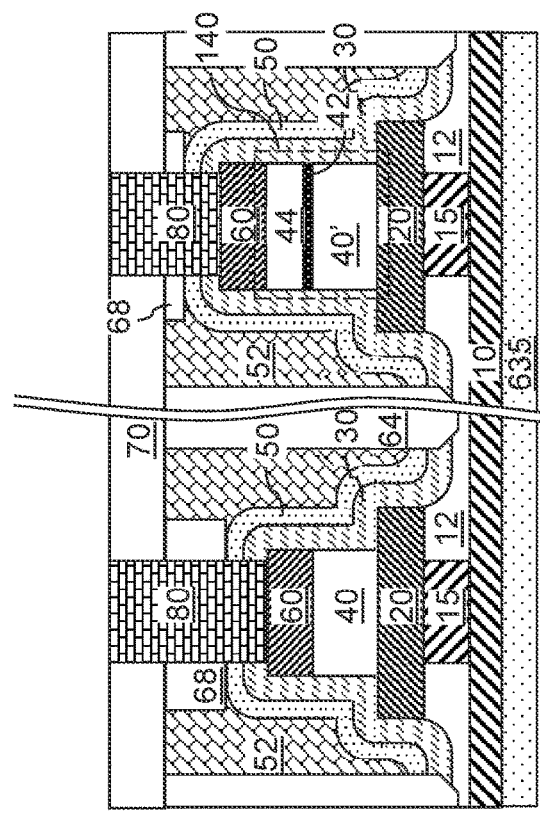
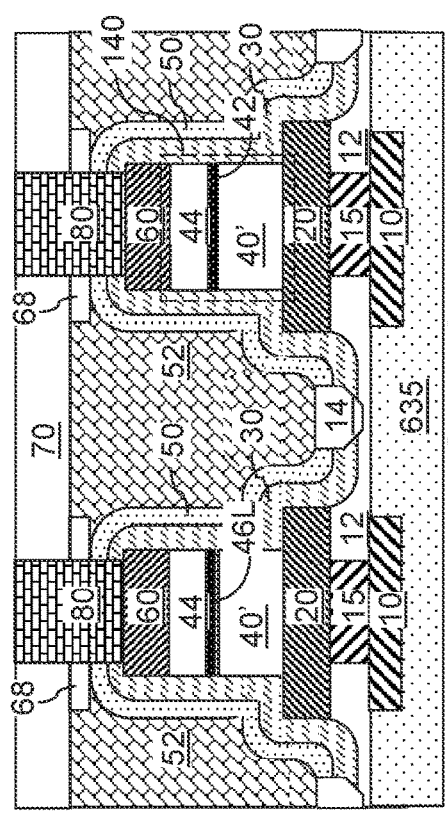
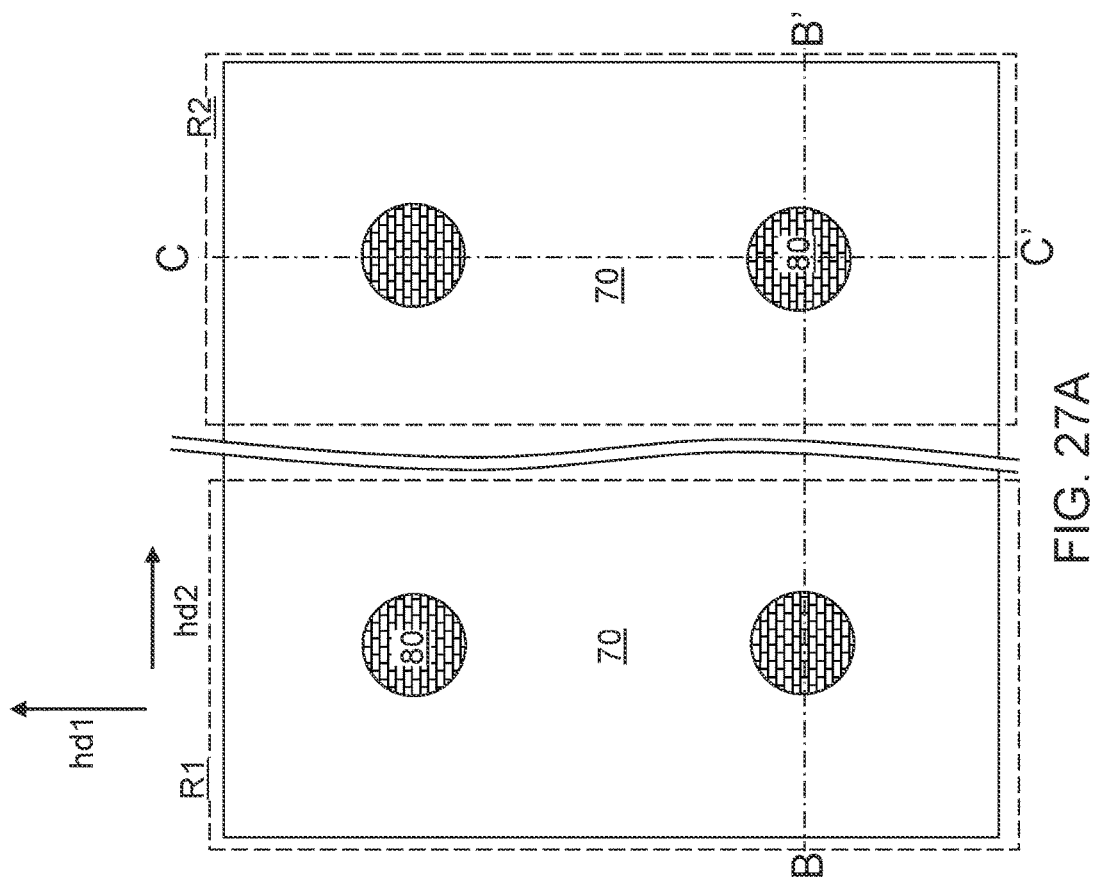
FIG. 27A
FIG. 27B
FIG. 27C

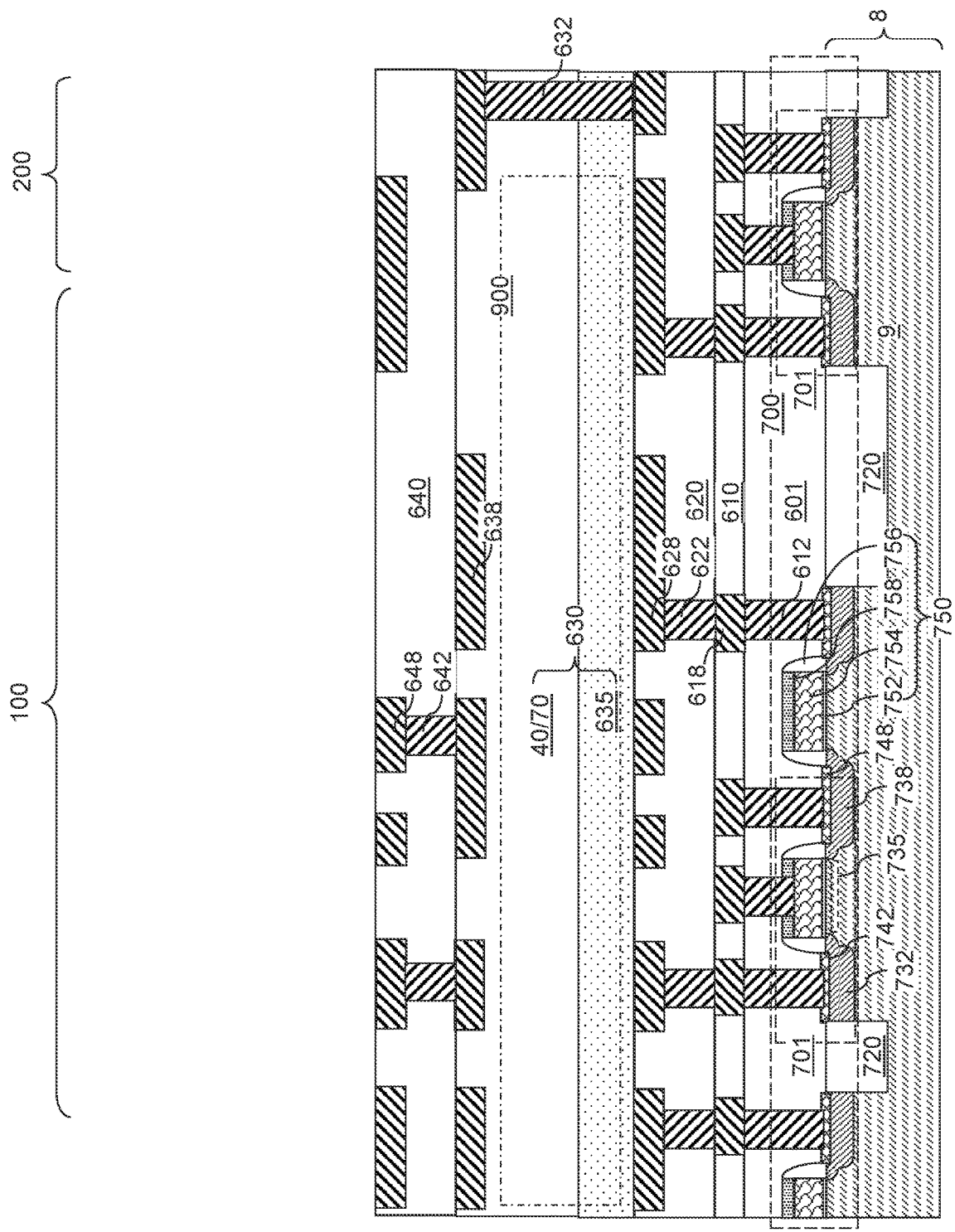

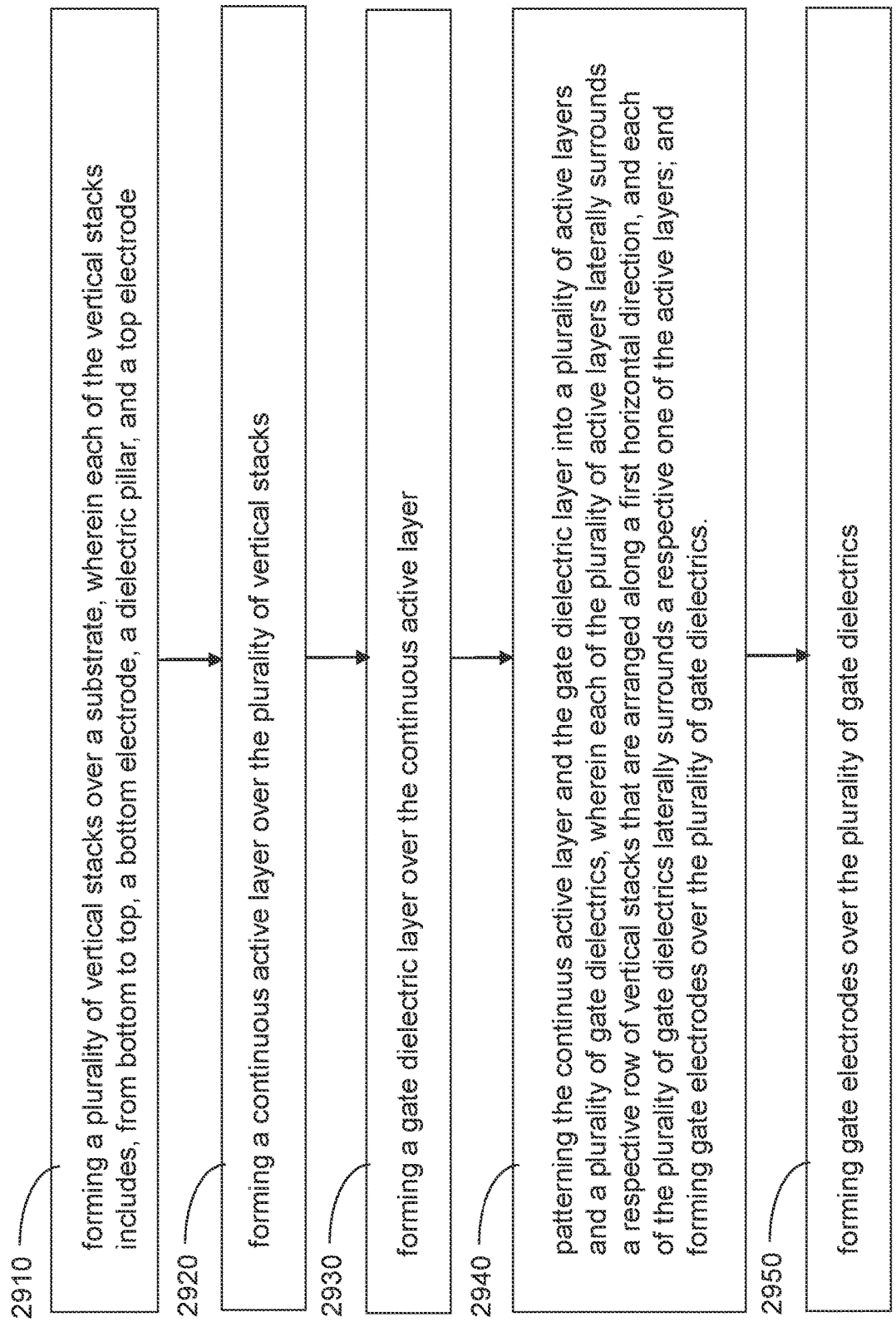

VERTICAL ACCESS TRANSISTORS AND METHODS FOR FORMING THE SAME

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of a memory array region of the first exemplary structure after formation of bit lines in an insulating matrix layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of a portion of a memory array region of the first exemplary structure after formation of bottom contact via structures and bottom electrodes according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of a portion of a memory array region of the first exemplary structure after formation of a dielectric pillar material layer, a first etch stop layer, and a first insulating matrix layer according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 5A is a top-down view of a portion of a memory array region of the first exemplary structure after formation of top electrodes in the first insulating matrix layer according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 7A is a top-down view of a portion of a memory array region of the first exemplary structure after formation of an active layer and a gate dielectric layer according to the first embodiment of the present disclosure.

FIG. 7B is a vertical cross-sectional view of the first exemplary structure along the vertical plane B-B' of FIG. 7A.

FIG. 7C is a vertical cross-sectional view of the first exemplary structure along the vertical plane C-C' of FIG. 7A.

FIG. 8A is a top-down view of a portion of a memory array region of the first exemplary structure after formation of a sacrificial matrix material layer according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 9A is a top-down view of a portion of a memory array region of the first exemplary structure after formation of an etch mask layer according to the first embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 11A is a top-down view of a portion of a memory array region of the first exemplary structure after formation of dielectric wall structures according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 12A is a top-down view of a portion of a memory array region of the first exemplary structure after formation of gate cavities according to the first embodiment of the present disclosure.

FIG. 12B is a vertical cross-sectional view of the first exemplary structure along the vertical plane B-B' of FIG. 12A.

FIG. 12C is a vertical cross-sectional view of the first exemplary structure along the vertical plane C-C' of FIG. 12A.

FIG. 14A is a top-down view of a portion of a memory array region of the first exemplary structure after formation of contact recesses according to the first embodiment of the present disclosure.

FIG. 14B is a vertical cross-sectional view of the first exemplary structure along the vertical plane B-B' of FIG. 14A.

FIG. 14C is a vertical cross-sectional view of the first exemplary structure along the vertical plane C-C' of FIG. 14A.

FIG. 15A is a top-down view of a portion of a memory array region of the first exemplary structure after formation of a contact-level dielectric layer and top contact via structures according to the first embodiment of the present disclosure.

FIG. 15B is a vertical cross-sectional view of the first exemplary structure along the vertical plane B-B' of FIG. 15A.

FIG. 15C is a vertical cross-sectional view of the first exemplary structure along the vertical plane C-C' of FIG. 15A.

FIG. 17A is a top-down view of a portion of a memory array region of the alternative configuration of the first exemplary structure after formation of capping dielectric plates according to the first embodiment of the present disclosure.

FIG. 17B is a vertical cross-sectional view of the first exemplary structure along the vertical plane B-B' of FIG. 17A.

FIG. 17C is a vertical cross-sectional view of the first exemplary structure along the vertical plane C-C' of FIG. 17A.

FIG. 19A is a top-down view of a portion of a memory array region of a second exemplary structure after formation of first bit lines, bottom contact via structures, and bottom electrodes that are merged to form second bit lines according to a second embodiment of the present disclosure.

FIG. 19B is a vertical cross-sectional view of the second exemplary structure along the vertical plane B-B' of FIG. 19A.

FIG. 19C is a vertical cross-sectional view of the second exemplary structure along the vertical plane C-C' of FIG. 19A.

FIG. 20A is a top-down view of a portion of a memory array region of the second exemplary structure after formation of vertical stacks of a bottom electrode, a dielectric pillar, and a top electrode according to the second embodiment of the present disclosure.

FIG. 20B is a vertical cross-sectional view of the second exemplary structure along the vertical plane B-B' of FIG. 20A.

FIG. 20C is a vertical cross-sectional view of the second exemplary structure along the vertical plane C-C' of FIG. 20A.

FIG. 21A is a top-down view of a portion of a memory array region of the second exemplary structure after formation of an active layer and a gate dielectric layer according to the second embodiment of the present disclosure.

FIG. 21B is a vertical cross-sectional view of the second exemplary structure along the vertical plane B-B' of FIG. 21A.

FIG. 21C is a vertical cross-sectional view of the second exemplary structure along the vertical plane C-C' of FIG. 21A.

FIG. 22A is a top-down view of a portion of a memory array region of the second exemplary structure after formation of a contact-level dielectric layer and top contact via structures according to the second embodiment of the present disclosure.

FIG. 22B is a vertical cross-sectional view of the second exemplary structure along the vertical plane B-B' of FIG. 22A.

FIG. 22C is a vertical cross-sectional view of the second exemplary structure along the vertical plane C-C' of FIG. 22A.

FIG. 23A is a top-down view of a portion of a memory array region of a third exemplary structure after formation of a dielectric pillar material layer, a first etch stop layer, a first insulating matrix layer, a second etch stop layer, and a second insulating matrix layer according to the third embodiment of the present disclosure.

FIG. 23B is a vertical cross-sectional view of the third exemplary structure along the vertical plane B-B' of FIG. 23A.

FIG. 23C is a vertical cross-sectional view of the third exemplary structure along the vertical plane C-C' of FIG. 23A.

FIG. 24A is a top-down view of a portion of a memory array region of the third exemplary structure after patterning the second insulating matrix layer and the second etch stop layer according to the third embodiment of the present disclosure.

FIG. 24B is a vertical cross-sectional view of the third exemplary structure along the vertical plane B-B' of FIG. 24A.

FIG. 24C is a vertical cross-sectional view of the third exemplary structure along the vertical plane C-C' of FIG. 24A.

FIG. 25A is a top-down view of a portion of a memory array region of the third exemplary structure after formation of top electrodes according to the third embodiment of the present disclosure.

FIG. 25B is a vertical cross-sectional view of the third exemplary structure along the vertical plane B-B' of FIG. 25A.

FIG. 25C is a vertical cross-sectional view of the third exemplary structure along the vertical plane C-C' of FIG. 25A.

FIG. 26A is a top-down view of a portion of a memory array region of the third exemplary structure after formation of vertical stacks of a bottom electrode, a dielectric pillar, and a top electrode according to the third embodiment of the present disclosure.

FIG. 26B is a vertical cross-sectional view of the third exemplary structure along the vertical plane B-B' of FIG. 26A.

FIG. 26C is a vertical cross-sectional view of the third exemplary structure along the vertical plane C-C' of FIG. 26A.

FIG. 27A is a top-down view of a portion of a memory array region of the third exemplary structure after formation of a contact-level dielectric layer and top contact via structures according to the third embodiment of the present disclosure.

FIG. 27B is a vertical cross-sectional view of the third exemplary structure along the vertical plane B-B' of FIG. 27A.

FIG. 27C is a vertical cross-sectional view of the third exemplary structure along the vertical plane C-C' of FIG. 27A.

FIG. 28 is a vertical cross-sectional view of an exemplary structure after formation of upper dielectric material layers and upper metal interconnect structures.

FIG. 29 is a flowchart that illustrates the general processing steps for manufacturing the semiconductor device of the present disclosure.

DETAILED DESCRIPTION

Figure 1:
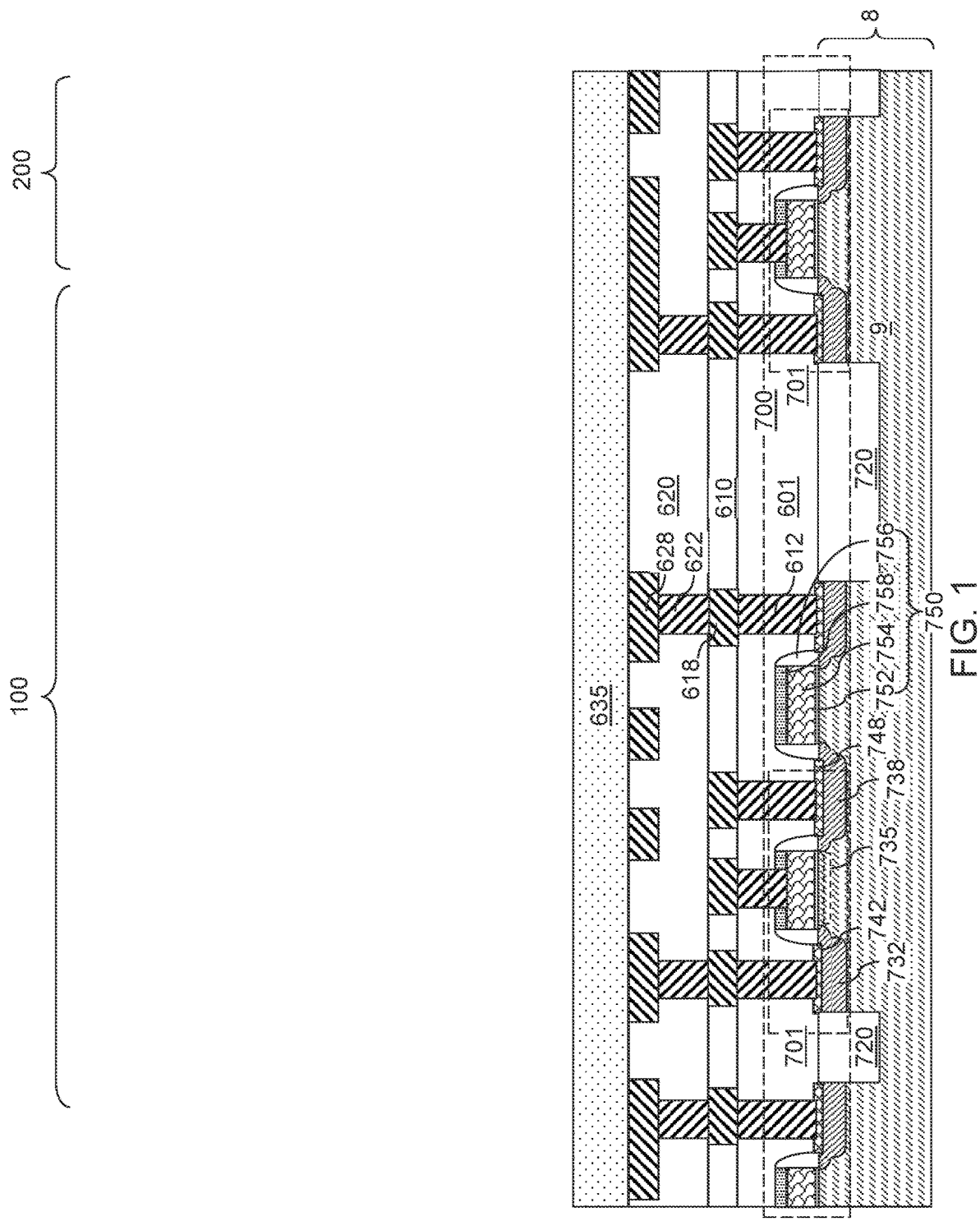
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

It may be difficult to scale conventional planar thin film transistor due to inherent limitations on material properties and due to the difficulty of process control in patterning small dimensions. While vertical device structures have been proposed to overcome the limitations of planar devices, such vertical devices typically suffer from insufficient source/drain-to-gate overlap, which adversely impacts device performance. Typically, the channel thickness is defined and restricted by the source metal, which degrades device control at the center of a channel region.

Generally, the structures and methods of the present disclosure may be used to form a semiconductor structure including vertical field effect transistors, which may include a two-dimensional array of vertical transistors (e.g., vertical thin film transistors). The vertical transistors may include a respective cylindrical semiconducting metal oxide channel and a gate electrode that may be shared among a row of vertical filed effect transistors. A source electrode and a drain electrode of each vertical field effect transistor may be vertically spaced by a dielectric pillar. An active layer and a gate dielectric can be subsequently formed over each vertical stack of a bottom electrode, a dielectric pillar, and a top electrode. The vertical transistor of the present disclosure includes a self-aligned cylindrical vertical channel that laterally surrounds a stack of a bottom electrode, a dielectric pillar, and a top electrode. The gate electrode may be formed in a gate-all-around configuration to provide enhanced channel control. The width of the channel may be the inner circumference of a cylindrical vertical channel, and provides a greater channel width per device area and increased on-current per device area than conventional channel designs.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of ferroelectric memory cells may be subsequently formed. The first exemplary structure may further include a peripheral region 200 in which metal wiring for the array of ferroelectric memory devices is provided. Generally, the field effect transistors 701 in the CMOS circuitry 700 may be electrically connected to an electrode of a respective ferroelectric memory cell by a respective set of metal interconnect structures.

Devices (such as field effect transistors 701) in the peripheral region 200 may provide functions that operate the array of ferroelectric memory cells to be subsequently formed. Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second line-and-via-level dielectric material layer 620, embodiments are expressly contemplated herein in which the array of memory cells may be formed at a different metal interconnect level.

An array of thin film transistors and an array of ferroelectric memory cells may be subsequently deposited over the dielectric material layers (601, 610, 620) that have formed therein the metal interconnect structures (612, 618, 622, 628). The set of all dielectric material layer that are formed prior to formation of an array of thin film transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an insulating matrix layer 635. The insulating matrix layer 635 includes a dielectric material such as undoped silicate glass, a doped silicate glass, organosilicate glass, or a porous dielectric material, and may be deposited by chemical vapor deposition. The thickness of the insulating matrix layer 635 may be in a range from 20 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The insulating matrix layer 635 may be formed over the interconnect-level dielectric layers.

Referring to FIGS. 2A-2C, a portion of a memory array region 100 of the first exemplary structure is illustrated after formation of bit lines 10 in the insulating matrix layer 635 according to a first embodiment of the present disclosure. The illustrated portion of the memory array region 100 corresponds to an area for forming four vertical field effect transistors. While the present disclosure is described using illustrations of an area for forming four vertical field effect transistors, the illustrated structure may be repeated along a first horizontal direction hd1 and along a second horizontal direction hd2 that is perpendicular to the first horizontal direction hd1 to provide a two-dimensional array of vertical field effect transistors containing more than four field effect transistors, such as millions of field effect transistors.

In one embodiment, line trenches may be formed in an upper portion of the insulating matrix layer 635, and may be filled with at least one metallic material to form bit lines 10. The line trenches may be laterally spaced apart from one another along the first horizontal direction hd1, and may laterally extend along the second horizontal direction hd2 (which is herein referred as a bit line direction). In one embodiment, the at least one metallic fill material may include a combination of a metallic liner layer including a metallic barrier material and a metallic fill material layer including a metallic fill material. The metallic liner layer may include a metallic barrier material such as TiN, TaN, WN, TiC, TaC, WC, or a stack thereof, and may be deposited by physical vapor deposition of chemical vapor deposition. Other suitable metallic liner materials are within the contemplated scope of disclosure. The thickness of the metallic liner layer may be in a range from 1 nm to 30 nm, although lesser and greater thicknesses may also be used. The metallic fill material layer may include W, Cu, Al, Co, Ru, Mo, Ta, Ti, alloys thereof, and/or combinations thereof. Other suitable metallic fill materials are within the contemplated scope of disclosure. A planarization process, such as a chemical mechanical polishing (CMP) process, may be performed to remove portions of the metallic liner layer and the metallic fill material layer that overlie the horizontal plane including the top surface of the insulating matrix layer 635. Each remaining portion of the at least one metallic material includes a bit line 10, which may be subsequently used to electrically bias bottom electrodes of thin film transistors to be formed.

The vertical thickness of the bit lines 10 may be in a range from 10 nm to 300 nm, such as from 30 nm to 100 nm, although lesser and greater vertical thicknesses may also be used. The bit lines 10 may be formed with a periodicity along the first horizontal direction hd1. The periodicity of the bit lines 10 may be the pitch of the field effect transistors along the first horizontal direction hd1, and may be, for example, in a range from 5 nm to 200 nm, such as from 10 nm to 100 nm, although lesser and greater periodicities may also be used. The width of each bit line 10 along the first horizontal direction hd1 may be in a range from 20% to 80%, such as from 30% to 70%, of the periodicity of the bit lines 10 along the first horizontal direction hd1.

Referring to FIGS. 3A-3C, an insulating layer 12 may be formed above the insulating matrix layer 635 and the bit lines 10, and may be patterned to form at least one array of openings therein. For example, a trimmable photoresist layer (not shown) may be applied over the insulating layer 12, and may be lithographically patterned to form an array of openings in the first photoresist layer. The array of openings in the trimmable photoresist layer may be transferred at least into an upper portion of the insulating layer 12 to form an array of cavities in the insulating layer 12 by performing a first anisotropic etch process. The trimmable photoresist layer may be isotropically trimmed to increase the size of the openings therethrough, and a second anisotropic etch process may be performed to extend the depth of pre-existing array of cavities down to the top surfaces of the bit lines 10 and to etch additional volumes of the upper portion of the insulating layer 12 around the pre-existing array of cavities. A two-dimensional array of stepped cavities may be formed in the insulating layer 12. Each stepped cavity includes a lower cavity portion having a respective first horizontal cross-sectional shape and located in a lower portion of the insulating layer 12, and an upper cavity portion having a respective second horizontal cross-sectional shape and located in an upper portion of the insulating layer 12. Each second horizontal cross-sectional shape may be laterally offset from the first horizontal cross-sectional shape of a same stepped cavity by a uniform lateral offset distance, which is the lateral trimming distance of the trimmable photoresist layer. The uniform lateral offset distance may be in a range from 1% to 20% of the periodicity of the bit lines 10 along the first horizontal direction hd1, and may be in a range from 1 nm to 40 nm, such as from 2 nm to 20 nm, although lesser and greater uniform lateral offset distances may also be used.

The two-dimensional array of stepped cavities may be filled with at least one metallic fill material. In one embodiment, the at least one metallic fill material may include a combination of a metallic liner layer including a metallic barrier material and a metallic fill material layer including a metallic fill material. The metallic liner layer may include a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may include W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the insulating layer 12.

Each remaining portion of the at least one metallic material includes a combination of a bottom contact via structure 15 and a bottom electrode 20. Specifically, each remaining portion of the at least one metallic material that fills a lower portion of a stepped cavity having a respective first horizontal cross-sectional shape constitutes a bottom contact via structure 15, and each remaining portion of the at least one metallic material that fills an upper portion of a stepped cavity having a respective second horizontal cross-sectional shape constitutes a bottom electrode 20. While the present disclosure is described using an embodiment in which the bottom contact via structures 15 and the bottom electrodes 20 are formed simultaneously, embodiments are expressly contemplated herein in which the bottom contact via structures 15 are formed first, and the bottom electrodes 20 are formed subsequently.

A two-dimensional array of bottom contact via structures 15 and a two-dimensional array of bottom electrodes 20 may be formed within the insulating layer 12. Each bottom contact via structure 15 contacts a bottom surface of a respective one of the bottom electrodes 20. The bit lines 10 contact a respective column of the bottom contact via structures 15 that are arranged along the second horizontal direction h2. Generally, the first horizontal cross-sectional shape of each bottom contact via structure 15 and the second horizontal cross-sectional shape of each bottom electrode 20 may be any two-dimensional shape having a closed periphery. For example, the horizontal cross-sectional shapes of the bottom contact via structures 15 and the bottom electrodes 20 may be shapes of a circle, ellipse, a rectangle, a rounded rectangle, or any two-dimensional curvilinear shape having a closed periphery. The top surfaces of the bottom electrodes 20 may be coplanar with the top surface of the insulating layer 12.

Referring to FIGS. 4A-4C, a layer stack including a dielectric pillar material layer 40L, a first etch stop layer 42L, and a first insulating matrix layer 44L may be sequentially formed above the two-dimensional array of bottom electrodes 20. Each of the dielectric pillar material layer 40L and the first insulating matrix layer 44L includes a dielectric material such as undoped silicate glass, a doped silicate glass, organosilicate glass, silicon nitride, silicon carbide nitride, silicon oxynitride, or a combination thereof. The materials of the dielectric pillar material layer 40L and the first insulating matrix layer 44L may be the same, or may be different. The first etch stop layer 42L includes a dielectric etch stop material that is different from the materials of the dielectric pillar material layer 40L and the first insulating matrix layer 44L. For example, the first etch stop layer 42L may include a high-k dielectric metal oxide material (such as hafnium oxide, lanthanum oxide, yttrium oxide, titanium oxide, tantalum oxide, aluminum oxide, etc.), silicon nitride, or silicon carbide nitride. The dielectric pillar material layer 40L, the first etch stop layer 42L, and the first insulating matrix layer 44L may be deposited by chemical vapor deposition processes. The thickness of the dielectric pillar material layer 40L may be in range from 1 nm to 200 nm, such as from 3 nm to 60 nm, and/or from 6 nm to 30 nm. The thickness of the first etch stop layer 42L may be in a range from 0.2 nm to 30 nm, such as from 1 nm to 5 nm, although lesser and greater thicknesses may also be used. The thickness of the first insulating matrix layer 44L may be in range from 1 nm to 200 nm, such as from 3 nm to 60 nm, and/or from 6 nm to 30 nm.

Referring to FIGS. 5A-5C, a photoresist layer (not shown) may be applied over the top surface of the first insulating matrix layer 44L, and may be lithographically patterned to form an array of openings having a same two-dimensional periodicity as the two-dimensional array of bottom electrodes 20. According to an aspect of the present disclosure, the areas of the openings in the photoresist layer may be located entirely within the areas of the two-dimensional array of bottom electrodes 20. In this embodiment, the periphery of each opening in the photoresist layer may be laterally offset inward from the periphery of a top surface of an underlying bottom electrode 20. In one embodiment, the lateral offset distance between the periphery of each opening in the photoresist layer and the periphery of the top surface of the underlying bottom electrode 20 in a plan view may be in a range from 1% to 30%, such as from 2% to 20% and/or from 3% to 10%, of the maximum lateral dimension of the underlying bottom electrode 20. For example, the lateral offset distance between the periphery of each opening in the photoresist layer and the periphery of the top surface of the underlying bottom electrode 20 in the plan view may be in a range from 0.5 nm to 100 nm, such as from 2 nm to 20 nm, although lesser and greater lateral offset distances may also be used.

An anisotropic etch process may be performed using the patterned photoresist layer as an etch mask layer. The first etch stop layer 42L may be used as an etch stop structure for the anisotropic etch process. A two-dimensional array of top electrode cavities may be formed in the first insulating matrix layer 44L underneath the two-dimensional array of openings in the photoresist layer. Optionally, an additional etch process (which may be an isotropic etch process or an anisotropic etch process) may be performed to etch physically exposed portions of the first etch stop layer 42L from underneath the two-dimensional array of top electrode cavities. The photoresist layer may be subsequently removed, for example, by ashing.

The two-dimensional array of top electrode cavities may be filled with at least one metallic fill material. In one embodiment, the at least one metallic fill material may include a combination of a metallic liner layer including a metallic barrier material and a metallic fill material layer including a metallic fill material. The metallic liner layer may include a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may include W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the first insulating matrix layer 44L. Remaining portions of the at least one metallic material include top electrodes 60. Top surfaces of the top electrodes 60 may be coplanar with the top surface of the first insulating matrix layer 44L.

A two-dimensional array of top electrodes 60 may be formed in the first insulating matrix layer 44L. Generally, a first subset of the top electrodes 60 may be formed in the first insulating matrix layer 44L. In one embodiment, the first subset of the top electrodes 60 may be the entire set of the top electrodes 60. Alternatively, another insulating matrix layer (not shown) may be formed over the first insulating matrix layer in another device region (not shown), and the top electrodes 60 may be formed in the topmost insulating matrix layer within a respective device region. The lateral distance between the device regions may be selected such that the planarization process used to form the top electrodes 60 is not significantly impeded by the height difference across different device regions.

Figure 6B:
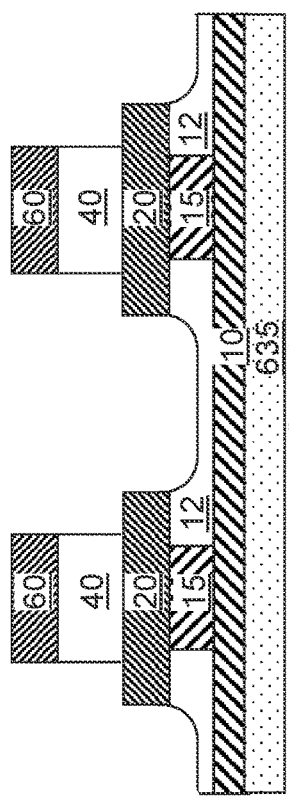
FIG. 6B is a vertical cross-sectional view of the first exemplary structure along the vertical plane B-B' of FIG. 6A.
Figure 6C:
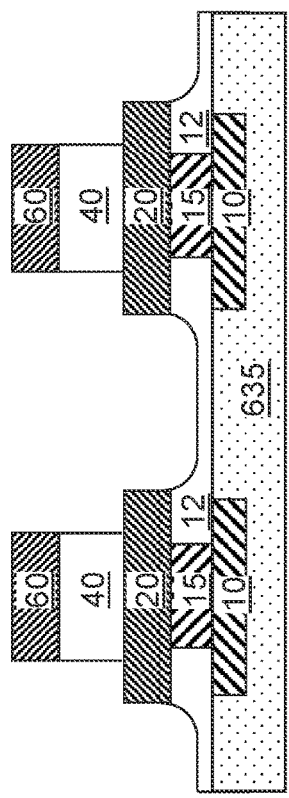
FIG. 6C is a vertical cross-sectional view of the first exemplary structure along the vertical plane C-C' of FIG. 6A.
Figure 6A:
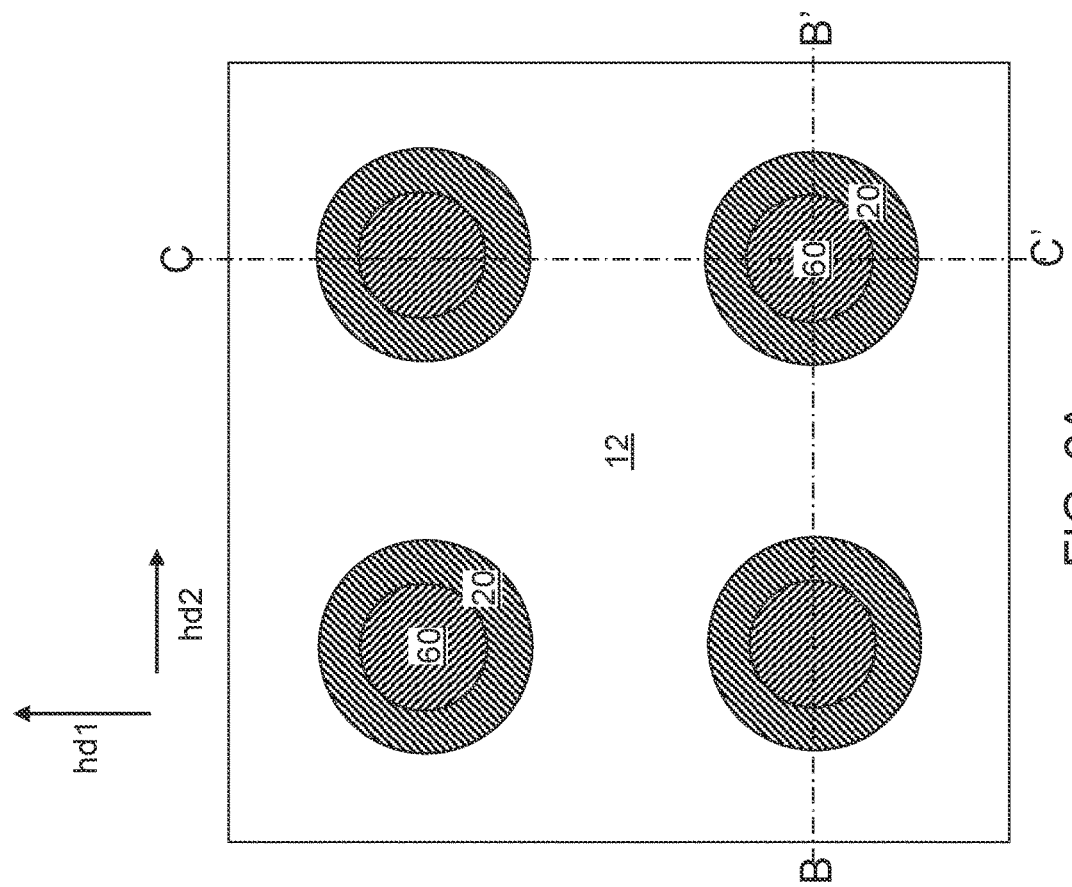
FIG. 6A is a top-down view of a portion of a memory array region of the first exemplary structure after formation of vertical stacks of a bottom electrode, a dielectric pillar, and a top electrode according to the first embodiment of the present disclosure.

Referring to FIGS. 6A-6C, an anisotropic etch process may be performed to etch portions of the first insulating matrix layer 44L, the first etch stop layer 42L, the dielectric pillar material layer 40L, and the insulating layer 12. The metallic materials of the top electrodes 60 and the bottom electrodes 20 may be used as an etch mask during the anisotropic etch process. As such, the anisotropic etch process is a self-aligned anisotropic etch process that uses pre-existing structural elements as an etch mask. In this embodiment, use of a lithographic mask (such as a patterned photoresist layer) is not necessary during the anisotropic etch process.

The anisotropic etch process may remove the entirety of remaining portions of the first insulating matrix layer 44L and the first etch stop layer 42L, and removes portions of the dielectric pillar material layer 40L that are not masked by the top electrodes 60. Thus, portions of the dielectric pillar material layer 40L that do not have an areal overlap with the top electrodes 60 are removed by the anisotropic etch process. Further, the anisotropic etch process may be optionally continued after peripheral portions of the top surfaces of the bottom electrodes 20 are physically exposed. In this embodiment, the physically exposed portions of the top surfaces of the bottom electrodes 20 function as an additional etch mask structure during subsequently anisotropic etching of the insulating layer 12. In one embodiment, the anisotropic etch process may be terminated before the insulating layer 12 is etched through so that exposure of the bit lines 10 may be avoided.

Each remaining patterned portion of the dielectric pillar material layer 40L constitutes a dielectric pillar 40. Each dielectric pillar 40 may have a same horizontal cross-sectional shape as a respective overlying top electrode 60. Each dielectric pillar 40 may have a uniform horizontal cross-sectional shape that is invariant under translation along the vertical direction. Sidewalls of the dielectric pillars 40 may be vertically coincident with sidewalls of the top electrodes 60. As used herein, a first surface and a second surface are vertically coincident if the second surface overlies or underlies the first surface and if a vertical plane exists that includes the first surface and the second surface.

Generally, the first insulating matrix layer 44L, the dielectric pillar material layer 40L, and optionally an upper portion of the insulating layer 12 may be anisotropically etched using the top electrodes 60 and the bottom electrodes 20 as an etch mask. Patterned remaining portions of the dielectric pillar material layer 40L include the dielectric pillars 40. A two-dimensional array of vertical stacks (20, 40, 60) may be formed over a substrate 8. Each of the vertical stacks (20, 40, 60) includes, from bottom to top, a bottom electrode 20, a dielectric pillar 40, and a top electrode 60. Within each of the vertical stacks (20, 40, 60), a top periphery of the dielectric pillar 40 coincides with a bottom periphery of the top electrode 60, and a top periphery of the bottom electrode 20 is laterally offset outward from a bottom periphery of the dielectric pillar 40.

Referring to FIGS. 7A-7C, a continuous active layer 30L and a gate dielectric layer 50L may be sequentially deposited over the two-dimensional array of vertical stacks (20, 40, 60).

The continuous active layer 30L may be deposited over the two-dimensional array of vertical stacks (20, 40, 60). In one embodiment, the semiconducting material may include a material providing electrical conductivity in a range from 1.0 S/cm to $1.0 \times 10^5$ S/cm upon suitable doping with electrical dopants (which may be p-type dopants or n-type dopants). Exemplary semiconducting materials that may be used for the continuous active layer 30L include, but are not limited to, indium gallium zinc oxide (IGZO), indium tungsten oxide, indium zinc oxide, indium tin oxide, gallium oxide, indium oxide, doped zinc oxide, doped indium oxide (such as tungsten-doped indium oxide), doped cadmium oxide, and various other doped variants derived therefrom. Other suitable semiconducting materials are within the contemplated scope of disclosure. In one embodiment, the semiconducting material of the continuous active layer 30L may include indium gallium zinc oxide.

The continuous active layer 30L may include an amorphous semiconducting material or a polycrystalline semiconducting material. The continuous active layer 30L may be deposited by physical vapor deposition or atomic layer deposition although other suitable deposition processes may be used. The thickness of the continuous active layer 30L may be in a range from 1 nm to 100 nm, such as from 2 nm to 50 nm and/or from 3 nm to 20 nm, although lesser and greater thicknesses may also be used. The continuous active layer 30L includes a horizontally-extending portion that laterally extends between neighboring pairs of the vertical stacks (20, 40, 60) over the entire area of the memory array region 100, a two-dimensional array of tubular portions laterally surrounding, and contacting, a respective vertical stack (20, 40, 60) within the two-dimensional array of vertical stacks (20, 40, 60), and a two-dimensional array of capping portions overlying a respective vertical stack (20, 40, 60) within the two-dimensional array of vertical stacks (20, 40, 60).

The gate dielectric layer 50L may be formed over the continuous active layer 30L by deposition of at least one gate dielectric material. The gate dielectric material may include, but is not limited to, silicon oxide, silicon oxynitride, a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. In one embodiment, the gate dielectric material of the gate dielectric layer 50L may include an oxide of at least one metal selected from In, Zn, Ga, Sn, Pb, Zr, Sr, Ru, Mn, Mg, Nb, Ta, Hf, Al, La, Sc, Ti, V, Cr, Mo, W, Fe, Co, Ni, Pd, Ir, Ag, and combinations thereof. The total atomic percentage of the at least one metal in the gate dielectric layer 50L may be in a range from 25% to 60%, such as from 33.3% to 50%. Some metals may be present at a dopant concentration, such as less than 1.0%. Other suitable dielectric materials are within the contemplated scope of disclosure. The gate dielectric material may be deposited by atomic layer deposition or chemical vapor deposition although other suitable deposition processes may be used. The thickness of the gate dielectric layer 50L may be in a range from 1 nm to 30 nm, such as from 2 nm to 10 nm, although lesser and greater thicknesses may also be used.

Referring to FIGS. 8A-8C, an etch mask layer 55 may be formed over the gate dielectric layer 50L. In one embodiment, the etch mask layer 55 may comprise a carbon-based patterning film such as Advanced Patterning Film™ by Applied Materials Inc.™ Generally, a patterning film including amorphous carbon and/or diamond-like carbon may be anisotropically deposited to function as the etch mask layer 55.

The etch mask layer 55 may be formed by depositing and optionally planarizing an etch mask material, and by patterning the etch mask material. Patterning of the etch mask material may be performed by applying a photoresist layer (not shown) thereupon, by lithographically patterning the photoresist layer with a line and space pattern that laterally extends along the second horizontal direction hd2 and laterally spaced apart along the first horizontal direction hd1, and by transferring the line and space pattern through the etch mask material. An anisotropic etch process may be performed to pattern the etch mask material into the etch mask layer 55. Each patterned strip of the etch mask layer 55 laterally extends along the second horizontal direction hd2, and covers a respective column of top electrodes 60. First isolation trenches 35 are formed between neighboring pairs of the patterned strips of the etch mask layer 55. While the present disclosure is described using an embodiment in which the patterned strips of the etch mask layer 55 have a respective uniform width along the first horizontal direction hd1, embodiments are expressly contemplated herein in which the patterned strips of the etch mask layer 55 have laterally undulating widths. The photoresist layer may be subsequently removed, for example, by ashing.

A first anisotropic etch process may be performed to etch portions of gate dielectric layer 50L, the continuous active layer 30L, and an upper region of the insulating layer 12 that are not masked by the etch mask layer 55. Thus, the pattern of the etch mask layer 55 may be transferred through the gate dielectric layer 50L, the continuous active layer 30L, and the upper region of the insulating layer 12 by the first anisotropic etch process. Each patterned portion of the gate dielectric layer 50L may include a gate dielectric strip 50S that laterally extend along the second horizontal direction hd2. Each patterned portion of the continuous active layer 30L may include an active strip 30S that laterally extends along the second horizontal direction hd2. Line-shaped recesses that laterally extend along the second horizontal direction hd2 are formed in an upper region of the insulating layer 12. The first isolation trenches 35 are vertically extended into the upper region of the insulating layer 12 by the first anisotropic etch process. Generally, material portions that are not masked by the etch mask layer 55 may be anisotropically etched until a top surface of the insulating layer 12 is physically exposed underneath each area that is not masked by the etch mask layer 55.

Referring to FIGS. 9A-9C, a dielectric fill material such as silicon oxide may be deposited in the first isolation trenches 35 by a conformal deposition process such as a chemical vapor deposition process. The dielectric fill material may be removed from above the horizontal plane including the top surface of the etch mask layer 55, for example, by a recess etch process. The recess etch process may comprise a wet etch process or a dry etch process. The dielectric fill material may be further recessed such that remaining portion of the deposited dielectric fill material have top surfaces located below the horizontal plane including the top surfaces of the top electrodes 60, and/or below the horizontal plane including the top surfaces of the dielectric pillars 40, and/or below the horizontal plane including the top surfaces of the bottom electrodes 20. Each remaining portion of the dielectric fill material includes a dielectric isolation structure 14.

Figure 10B:
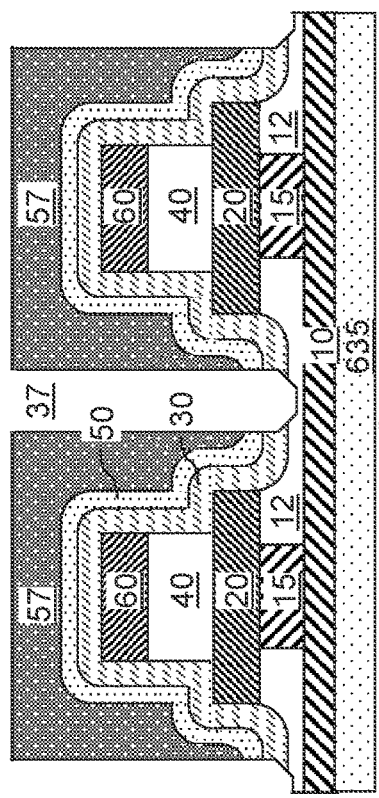
FIG. 10B is a vertical cross-sectional view of the first exemplary structure along the vertical plane B-B' of FIG. 10A.
Figure 10C:
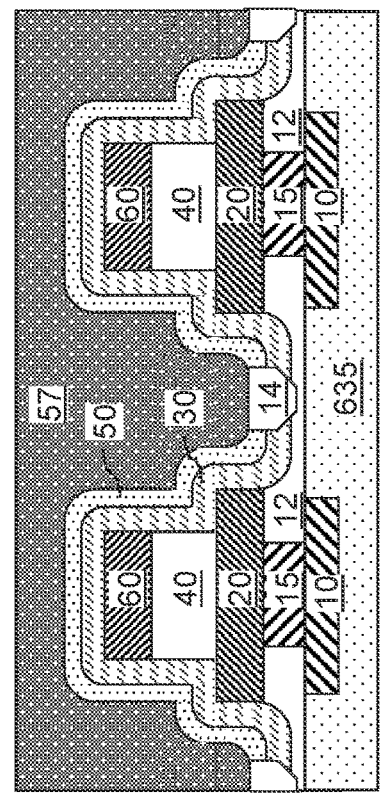
FIG. 10C is a vertical cross-sectional view of the first exemplary structure along the vertical plane C-C' of FIG. 10A.
Figure 10A:
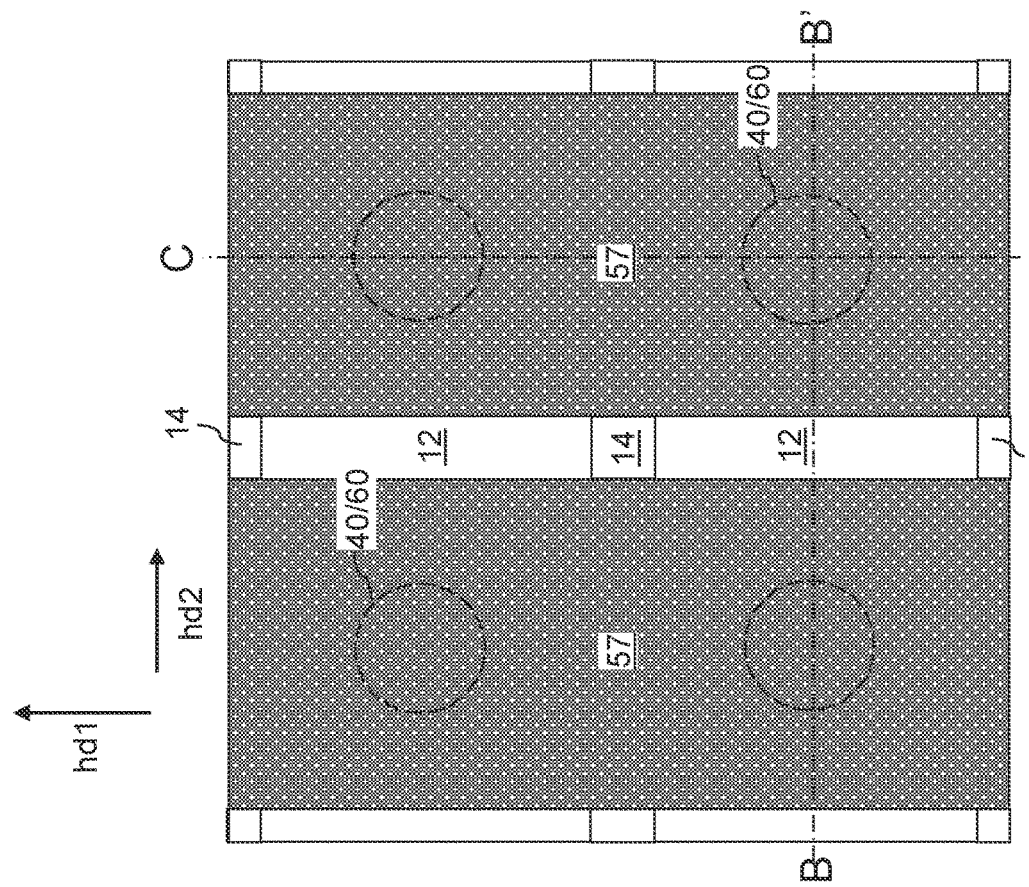
FIG. 10A is a top-down view of a portion of a memory array region of the first exemplary structure after patterning the sacrificial matrix material layer into sacrificial material strips according to the first embodiment of the present disclosure.

Referring to FIGS. 10A-10C, sacrificial material strips 57 may be formed over the gate dielectric strips 50S. The sacrificial material strips 57 may include a sacrificial material that may be subsequently removed selective to the materials of the gate dielectric strips 50S and the dielectric isolation structures 14. In one embodiment, the sacrificial material strips 57 may comprise silicon nitride, organosilicate glass, borosilicate glass, amorphous silicon, a silicon-germanium alloy, or a carbon-based material such as amorphous carbon or diamond-like carbon.

In one embodiment, the sacrificial material strips 57 may be formed by depositing a sacrificial matrix material layer and by patterning the sacrificial matrix layer into the sacrificial material strips 57. Patterning of the sacrificial matrix material layer may be performed by applying a photoresist layer (not shown) thereupon, by lithographically patterning the photoresist layer with a line and space pattern that laterally extends along the first horizontal direction hd1 and laterally spaced apart along the second horizontal direction hd2, and by transferring the line and space pattern through the sacrificial matrix material layer. An anisotropic etch process may be performed to pattern the sacrificial matrix material layer into the sacrificial material strips 57. Each patterned strip of the sacrificial material strips 57 laterally extends along the first horizontal direction hd1, and covers a respective row of top electrodes 60. Second isolation trenches 37 may be formed between neighboring pairs of the sacrificial material strips 57. While the present disclosure is described using an embodiment in which the sacrificial material strips 57 have a respective uniform width along the first horizontal direction hd1, embodiments are expressly contemplated herein in which the sacrificial material strips 57 have laterally undulating widths. The photoresist layer may be subsequently removed, for example, by ashing.

A second anisotropic etch process may be performed to etch portions of gate dielectric strips 50S, the active strips 30S, and an upper region of the insulating layer 12 that are not masked by the sacrificial material strips 57. Thus, the pattern of the sacrificial material strips 57 may be transferred through the gate dielectric strips 50S, the active strips 30S, and the upper region of the insulating layer 12 by the second anisotropic etch process. Each patterned portion of the gate dielectric strips 50S may include a gate dielectric 50 that overlies a single top electrode 60 and does not overlie any other top electrode 60. Each patterned portion of the active strips 30S may include an active layer 30 that overlies a single top electrode 60 and does not overlie any other top electrode 60. Line-shaped recesses that laterally extend along the first horizontal direction hd1 may be formed in an upper region of the insulating layer 12. The second isolation trenches 37 are vertically extended into the upper region of the insulating layer 12 by the second anisotropic etch process. Generally, material portions that are not masked by the sacrificial material strips 57 may be anisotropically etched until a top surface of the insulating layer 12 may be physically exposed underneath each area that is not masked by the sacrificial material strips 57.

Referring to FIGS. 11A-11C, a dielectric fill material such as undoped silicate glass, a doped silicate glass, or organosilicate glass may be deposited in the second isolation trenches 79. A reflow process may be performed as needed to facilitate filling of the volumes of the isolation trenches with the dielectric fill material. Excess portions of the dielectric fill material may be removed from above the horizontal plane including the top surfaces of the sacrificial material strips 57 by a planarization process such as a chemical mechanical polishing (CMP) process and/or a recess etch process. Remaining portions of the dielectric fill material that fill the second isolation trenches 37 constitute dielectric wall structures 64. In one embodiment, top surfaces of the dielectric wall structures 64 may be coplanar with the top surfaces of the sacrificial material strips 57. The dielectric wall structures 64 laterally extend along the first horizontal direction hd1 between a respective neighboring pair of sacrificial material strips 57 and vertically extend at least from a first horizontal plane including top surfaces of the top electrodes 60 to a second horizontal plane including top surfaces of the sacrificial material strips 57. In one embodiment, the dielectric wall structures 64 vertically extend from a respective surface segment of the insulating layer 12 to the second horizontal plane.

Generally, the gate dielectric layer 50L may be divided into a plurality of gate dielectrics 50. The continuous active layer 30L may be divided into a plurality of active layers 30. The plurality of vertical stacks (20, 40, 60) may be arranged as a two-dimensional periodic array, and a plurality of stacks of an active layer 30 and a gate dielectric 50 may be arranged as a two-dimensional periodic array. The second isolation trenches 37 and the dielectric wall structures 64 laterally extend along the first horizontal hd1 between a respective neighboring pair of rows of vertical stacks (20, 40, 60) selected from the plurality of vertical stacks (20, 40, 60). Each of the plurality of active layers 30 and each of the plurality of gate dielectrics 50 overlies and laterally surrounds a respective vertical stack (20, 40, 60). Each of the plurality of gate dielectrics 50 laterally surrounds, and overlies, a respective one of the active layers 30, and each of the plurality of sacrificial material strips 57 laterally surrounds, and overlies, a respective row of the gate dielectrics 50 and a respective row of the active layers 30 that are arranged along the first horizontal direction hd1. The continuous active layer 30L, the gate dielectric layer 50L, and the sacrificial matrix material layer may be divided into a two-dimensional array of active layers 30, a two-dimensional array of gate dielectrics 50, and a one-dimensional array of sacrificial material strips 57 by the second isolation trenches 39 and the dielectric wall structures 64.

Each of the active layers 30 comprises, and/or consists essentially of, a semiconducting metal oxide material, and extend over sidewalls of a respective one of vertical stacks (20, 40, 60). The gate dielectrics 50 extend over a respective one of the active layers 30. Each of the active layers 30 comprises a horizontally-extending portion and a tubular portion laterally surrounding, and contacting, a respective vertical stack (20, 40, 60). In one embodiment, each of the active layers 30 contacts a top surface of a bottom electrode 20. In one embodiment, the contact area between an active layer 30 and a bottom electrode 20 may be an annular area. Each of the active layers 30 contacts a top surface of a top electrodes 60.

Referring to FIGS. 12A-12C, a selective removal process that removes the material of the sacrificial material strips 57 selective to the materials of the gate dielectrics 50 and the dielectric wall structure 64 may be performed. The selective removal process may include an etch process such as an isotropic etch process, or may include an ashing process in embodiments in which the sacrificial material strips 57 include an ashable material. For example, if the sacrificial material strips 57 include silicon nitride, a wet etch process using hot phosphoric acid may be performed to remove the sacrificial material strips 57. Alternatively, if the sacrificial material strips 57 include an ashable material such as amorphous carbon, an ashing process may be used to remove the sacrificial material strips 57. Gate cavities 59 are formed in volumes from which the sacrificial material strips 57 are removed. Each gate cavity 59 laterally extends along the first horizontal direction hd1, and laterally surrounds a respective row of vertical stacks (20, 40, 60).

Figure 13B:
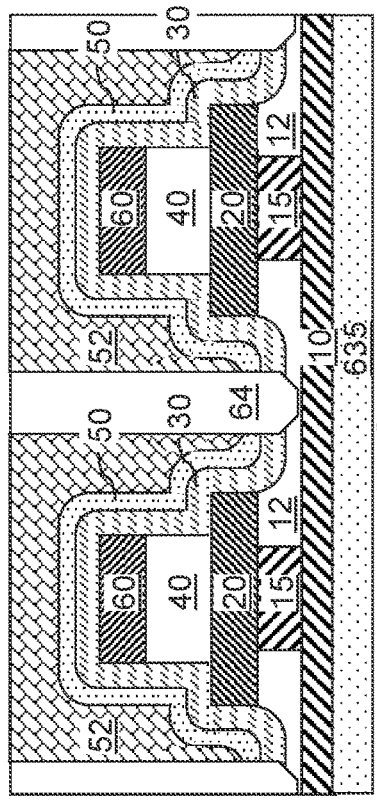
FIG. 13B is a vertical cross-sectional view of the first exemplary structure along the vertical plane B-B' of FIG. 13A.
Figure 13C:
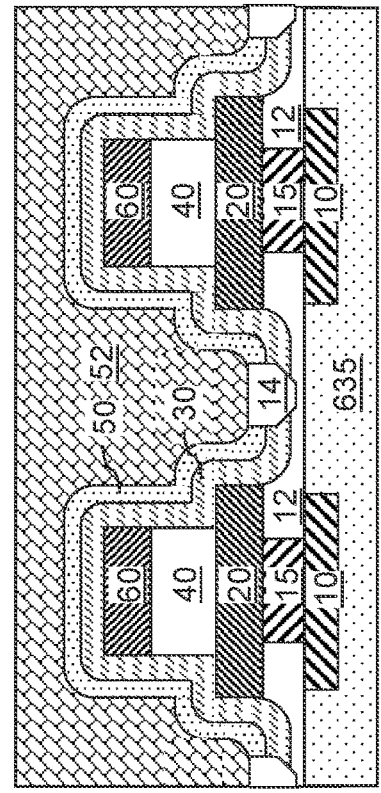
FIG. 13C is a vertical cross-sectional view of the first exemplary structure along the vertical plane C-C' of FIG. 13A.
Figure 13A:
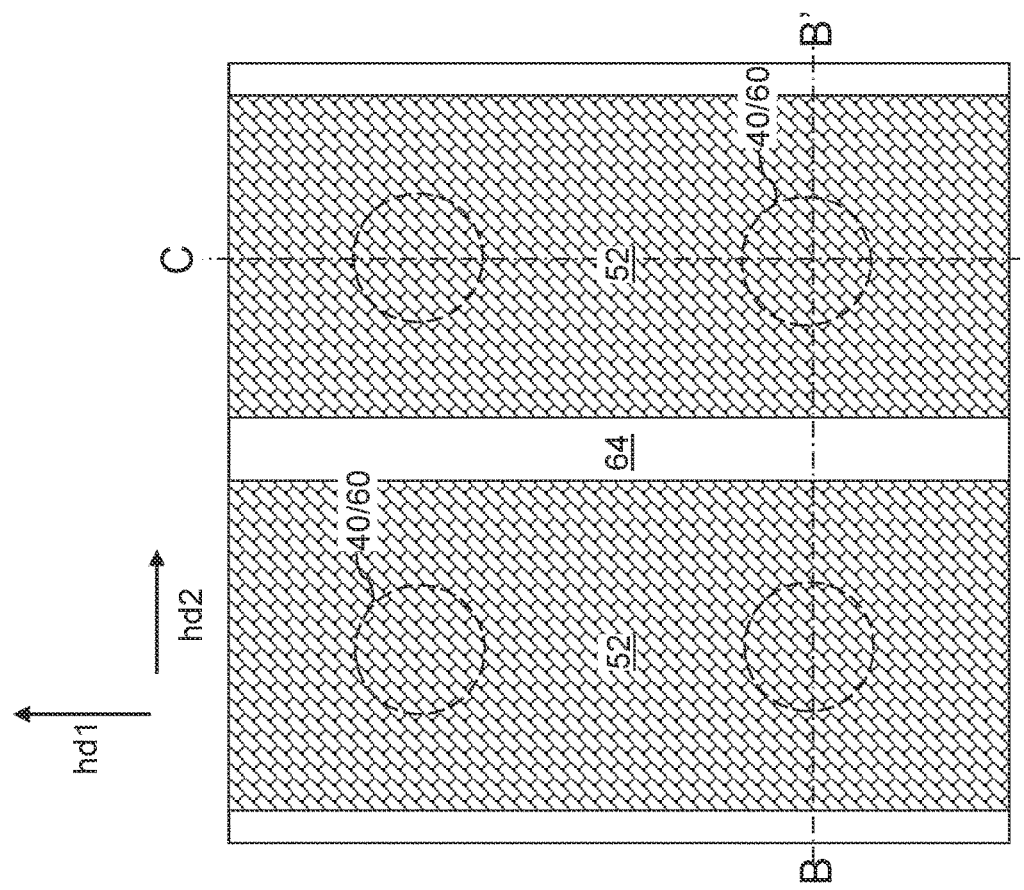
FIG. 13A is a top-down view of a portion of a memory array region of the first exemplary structure after formation of gate electrodes according to the first embodiment of the present disclosure.

Referring to FIGS. 13A-13C, at least one metallic fill material may be deposited in the gate cavities 59. In one embodiment, the at least one metallic fill material may include a combination of a metallic liner layer including a metallic barrier material and a metallic fill material layer including a metallic fill material. The metallic liner layer may include a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may include W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the dielectric wall structures 64. Each remaining portion of the at least one metallic material includes a gate electrode 52. In one embodiment, top surfaces of the gate electrodes 52 may be coplanar with the top surfaces of the dielectric wall structure 64. The gate electrodes 52 are formed over the plurality of gate dielectrics 50. Thus, the plurality of sacrificial material strips 57 is replaced with the gate electrodes 52.

The gate electrodes 52 laterally surround, and overlie, a respective one of the gate dielectrics 50. The gate electrodes 52 laterally extend along the first horizontal direction hd1, and are laterally spaced apart along the second horizontal direction hd2. Each gate electrode 52 laterally surrounds a respective row of vertical stacks (20, 40, 60) of a bottom electrode 20, a dielectric pillar 40, and a top electrode 60. Each vertically-extending portion of an active layer 30 includes a channel region of a thin film transistor, and is laterally surrounded by a respective gate electrode 52. Thus, the gate electrodes 52 of the present disclosure provide a gate-all-around configuration for each vertical thin film transistor.

Referring to FIGS. 14A-14C, a photoresist layer (not shown) may be applied over the gate electrodes 52 and the dielectric wall structures 64, and may be lithographically patterned to form a two-dimensional array of openings. Each of the openings in the photoresist layer may be located within the area of a respective underlying top electrode 60. An anisotropic etch process may be performed to etch unmasked portions of the gate electrodes 52, the gate dielectrics 50, and the active layers 30. Contact recesses 69 are formed within volumes from which the materials of the gate electrodes 52, the gate dielectrics 50, and the active layers 30 are removed. A top surface of a top electrode 60 is physically exposed at the bottom of each contact recess 69. Each of the top electrodes 60 includes a peripheral portion, such as an annular peripheral portion, that is contacted by a respective one of the active layers 30. In one embodiment, sidewalls of the contact recesses 69 may be vertical, or may be tapered, or may include vertical segments and tapered segments.

Referring to FIGS. 15A-15C, a dielectric material may be deposited in the contact recesses and over the gate electrodes 52 to form a contact-level dielectric layer 70. The contact-level dielectric layer 70 includes a dielectric material such as undoped silicate glass, a doped silicate glass, or organosilicate glass. The thickness of the contact-level dielectric layer 70, as measured above the gate electrodes 52, may be in a range from 30 nm to 600 nm, such as from 60 nm to 300 nm, although lesser and greater thicknesses may also be used.

A photoresist layer (not shown) may be applied over the contact-level dielectric layer 70, and may be lithographically patterned to form a two-dimensional array of opening therein. The pattern of the two-dimensional array of openings in the photoresist layer may have the same periodicity as the two-dimensional array of top electrodes 60. The size of each opening in the photoresist layer may be smaller than the size of an underlying contact recess 69 (which is filled with the contact-level dielectric layer 70). An anisotropic etch process may be performed to transfer the pattern of the openings in the photoresist layer through the contact-level dielectric layer 70. Contact via cavities may be formed within volumes from which the material of the contact-level dielectric layer 70 is removed. A top surface of a top electrode 60 may be physically exposed at the bottom of each contact via cavity. Each contact via cavity may be laterally bounded by a sidewall or sidewalls of the contact-level dielectric layer 70.

At least one metallic fill material may be deposited in the contact via cavities. In one embodiment, the at least one metallic fill material may include a combination of a metallic liner layer including a metallic barrier material and a metallic fill material layer including a metallic fill material. The metallic liner layer may include a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may include W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the contact-level dielectric layer 70. Each remaining portion of the at least one metallic material includes a top contact via structure 80. In one embodiment, top surfaces of the top contact via structures 80 may be coplanar with the top surfaces of the top contact via structures 80. Each of the top electrodes 60 may be contacted by a respective one of the top contact via structures 80.

The contact-level dielectric layer 70 overlies the gate electrodes 52, the active layers 30, the gate dielectrics 50, and the vertical stacks (20, 40, 60). The top contact via structures 80 are formed through the contact-level dielectric layer 70 and on a respective one of the top electrodes 60. A two-dimensional array of top contact via structures 80 vertically extends through the contact-level dielectric layer 70, contacts a respective one of the top electrodes 60, and is electrically isolated from the gate electrodes 50 by a respective dielectric material portion overlying the respective one of the top electrodes 60. The dielectric material portion may be a downward-protruding cylindrical portion of the contact-level dielectric layer 70. In this embodiment, the top contact via structures 80 are electrically isolated from the gate electrodes 52 by downward-protruding portions of the contact-level dielectric layer 70.

Figure 16B:
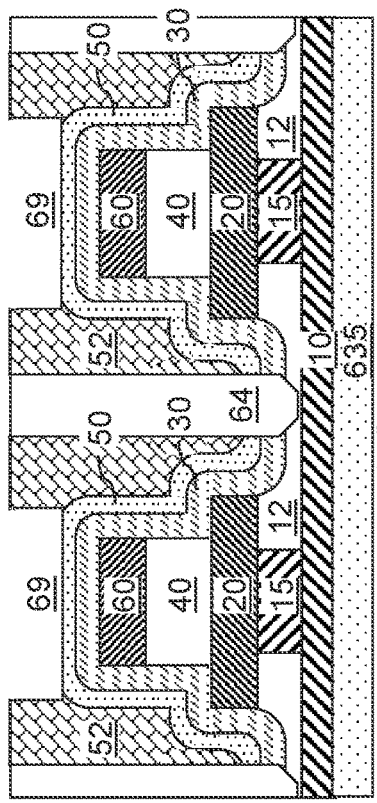
FIG. 16B is a vertical cross-sectional view of the first exemplary structure along the vertical plane B-B' of FIG. 16A.
Figure 16C:
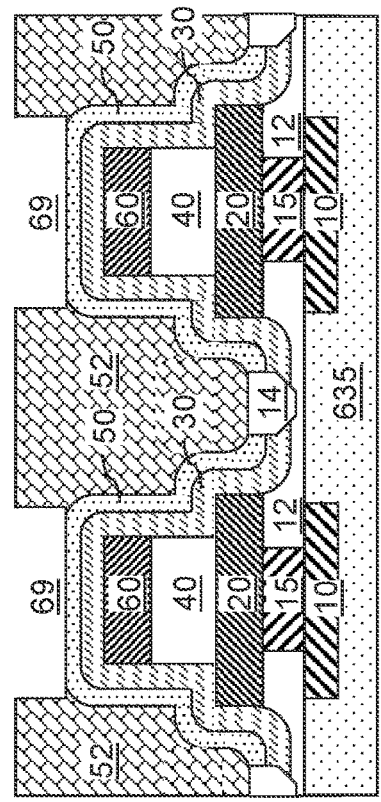
FIG. 16C is a vertical cross-sectional view of the first exemplary structure along the vertical plane C-C' of FIG. 16A.
Figure 16A:
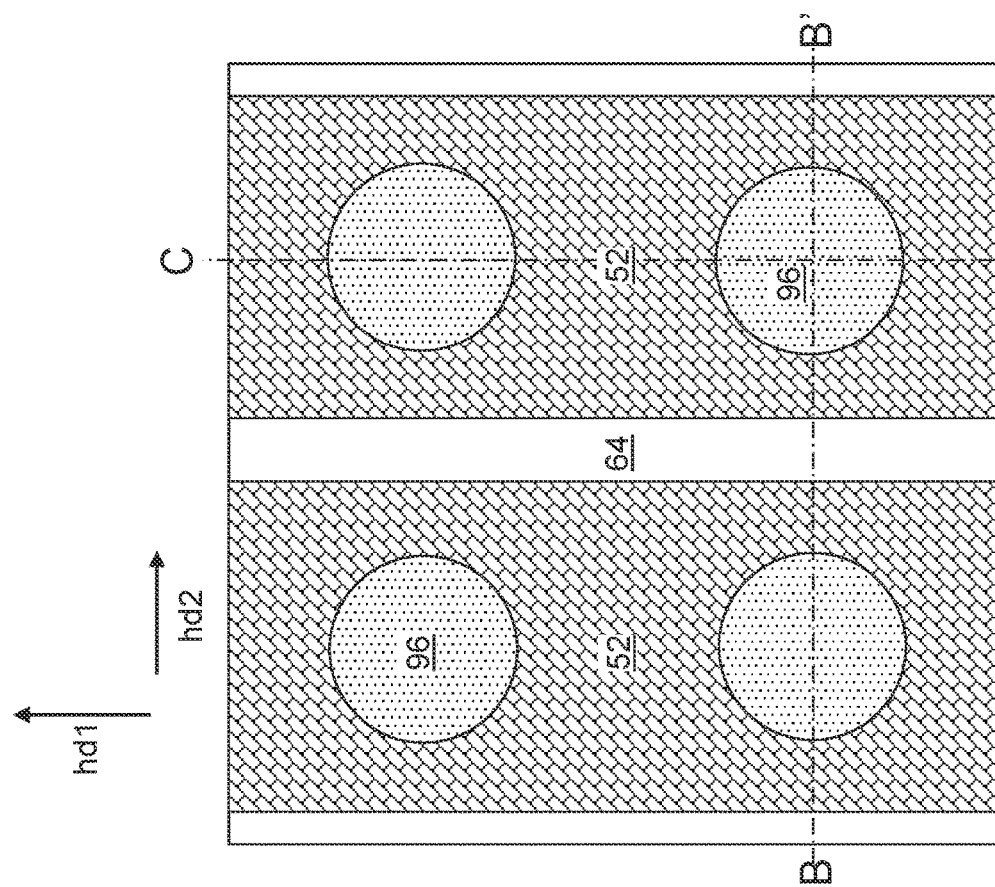
FIG. 16A is a top-down view of a portion of a memory array region of an alternative configuration of the first exemplary structure after formation of contact recesses according to the first embodiment of the present disclosure.

Referring to FIGS. 16A-16C, a portion of a memory array region 100 of an alternative configuration of the first exemplary structure according to the first embodiment of the present disclosure is illustrated after formation of contact recesses 69. The alternative configuration of the first exemplary structure may be derived from the first exemplary structure illustrated in FIGS. 14A-14C by terminating the anisotropic etch process that forms the contact recesses 69 after etching through the gate electrodes 52 and prior to etching physically exposed portions of the gate dialectics 50. In this embodiment, the chemistry of the anisotropic etch step that etches the material of the gate electrode 52 may be selective to the material of the gate dielectrics 50. Thus, a top surface of a gate dielectric 50 may be physically exposed at the bottom of each contact recess 69.

Referring to FIGS. 17A-17C, a dielectric fill material may be deposited in the contact recesses 69. The dielectric fill material may include undoped silicate glass, a doped silicate glass, organosilicate glass, or silicon nitride. In one embodiment, excess portions of the dielectric fill material may be removed from above the horizontal plane including the top surfaces of the gate electrodes 52 by performing a planarization process such as a chemical mechanical polishing process and/or a recess etch process. In this embodiment, remaining portions of the dielectric fill material include capping dielectric plates 68. In one embodiment the top surfaces of the capping dielectric plates 68 may be located within a same horizontal plane as the top surfaces of the gate electrodes 52. Alternatively, in embodiments in which the planarization process is not performed, a contact-level dielectric layer 70 may be formed over the gate electrodes 52 and vertically-protruding portions of the contact-level dielectric layer 70 may fill the contact recesses 69.

Figure 18B:
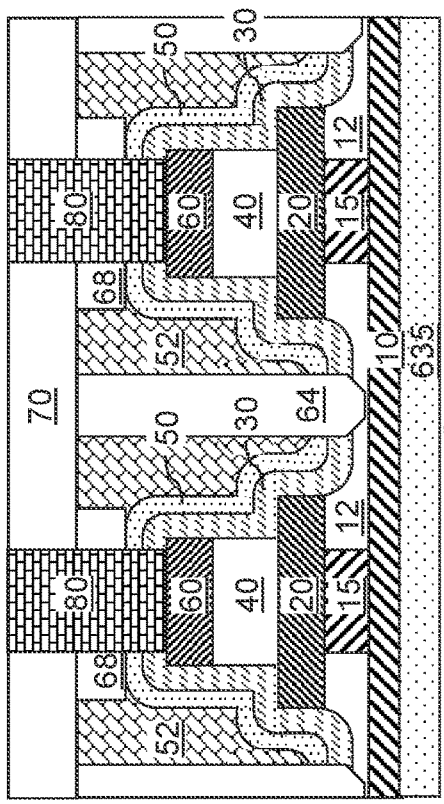
FIG. 18B is a vertical cross-sectional view of the first exemplary structure along the vertical plane B-B' of FIG. 18A.
Figure 18C:
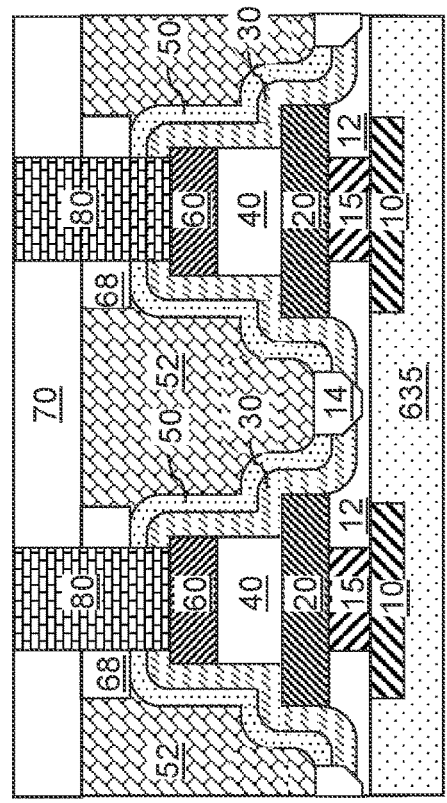
FIG. 18C is a vertical cross-sectional view of the first exemplary structure along the vertical plane C-C' of FIG. 18A.
Figure 18A:
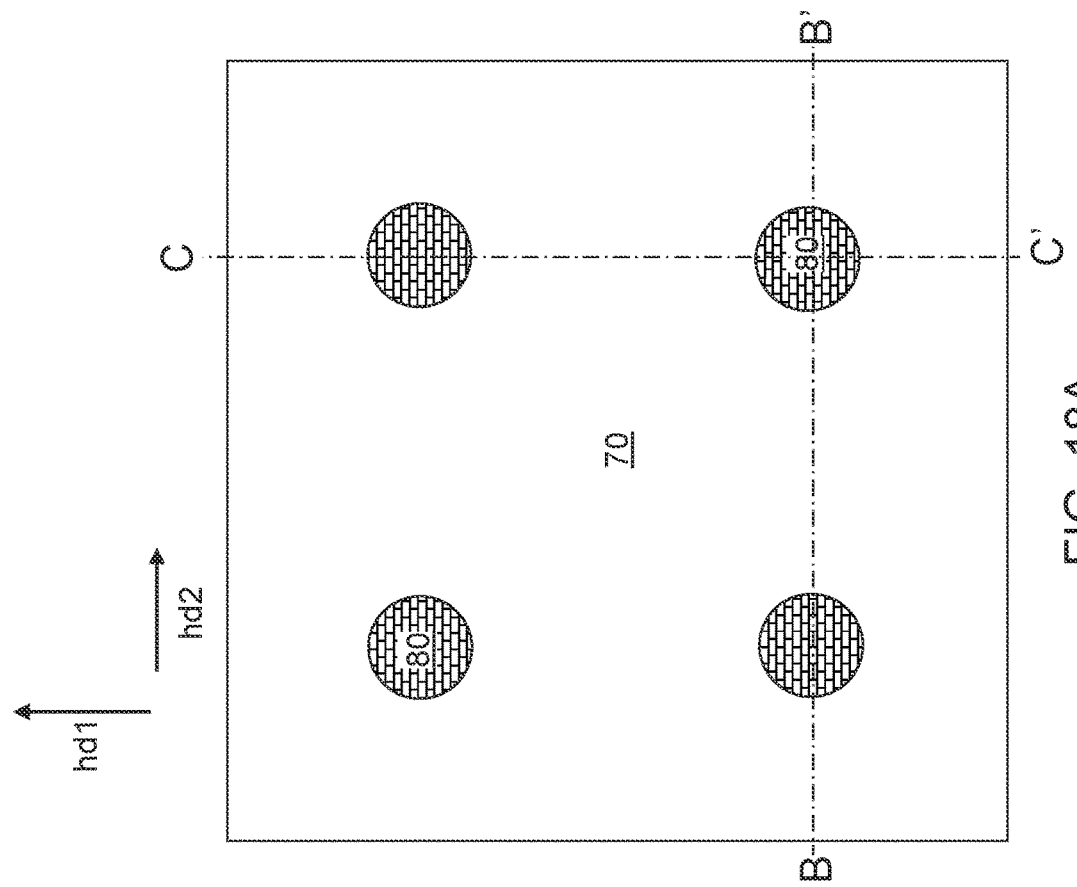
FIG. 18A is a top-down view of a portion of a memory array region of the alternative configuration of the first exemplary structure after formation of a contact-level dielectric layer and top contact via structures according to the first embodiment of the present disclosure.

Referring to FIGS. 18A-18C, the processing steps of FIGS. 15A-15C may be performed mutatis mutandis to form a contact-level dielectric layer 70 and an array of top contact via structures 80. In this embodiment, the anisotropic etch process that forms an array of contact via cavities may be modified to sequentially etch unmasked portions of the contact-level dielectric layer 70, the capping dielectric plates 68, portions of the gate dielectrics 50 that overlie the top electrodes 60, and portions of the active layers 30 that overlie the top electrodes 60.

A two-dimensional array of top contact via structures 80 vertically extends through the contact-level dielectric layer 70, contacts a respective one of the top electrodes 60, and is electrically isolated from the gate electrodes 50 by a respective dielectric material portion overlying the respective one of the top electrodes 60. The dielectric material portion may be a capping dielectric plate 68. In this embodiment, the top contact via structures 80 are electrically isolated from the gate electrodes 52 by the capping dielectric plates 68, which are dielectric material portions that overlie the top electrodes 60.

Referring to FIGS. 19A-19C, a portion of a memory array region 100 of a second exemplary structure according to a second embodiment of the present disclosure is illustrated after formation of first bit lines 10, bottom contact via structures 15, and bottom electrodes 20 that may be merged to form second bit lines. The first bit lines 10 of the second exemplary structure may be the same as the bit lines 10 of the first exemplary structure. The bottom contact via structures 15 and the second bit lines embodying merged bottom electrodes 20 may be formed by a dual damascene process. For example, the dual damascene process may use two lithographic patterning steps that define via cavities in which the bottom contact via structures 15 are subsequently formed and line trenches in which the bottom electrodes 20 are subsequently formed. Further, the dual damascene process may use a metal fill process that deposits at least one metallic material in the dual damascene cavities including the merged volumes of the via cavities and the line trenches and removes, and a planarization process (such as a chemical mechanical polishing process) that removes excess portions of the at least one metallic material from above the horizontal plane including the top surface of the insulating layer 12.

Generally, the second exemplary structure illustrated in FIGS. 19A-19C may be derived from the first exemplary structure illustrated in FIGS. 3A-3C by modifying the pattern of the bottom electrodes 20 such that bottom electrodes 20 arranged along the second horizontal direction hd2 are merged together to form an additional bit line, which is herein referred to as the second bit lines. In other words, each column of the bottom electrodes 20 that are arranged along the second horizontal direction may be merged into a respective contiguous metal line to provide upper bit lines that laterally extend along the second horizontal direction hd2. In this embodiment, the second exemplary structure includes lower bit lines 10 that laterally extend along the second horizontal direction hd2, underlie a respective one of the upper bit lines, and are electrically connected to the respective one of the upper bit lines by a respective column of bottom contact via structures 15.

Referring to FIGS. 20A-20C, the processing steps of FIGS. 4A-4C and 5A-5C may be performed. The processing steps of FIGS. 6A-6C may be performed with a modification such that the anisotropic etch process stops at, or does not etch a significant portion of, the insulating layer 12. In one embodiment, detection of physically exposed surfaces of the bottom electrodes 20 (including the upper bit lines) may be used as an endpoint signal for the anisotropic etch step that etches the material of the dielectric pillar material layer 40L. A two-dimensional array of a bottom electrode 20 (including a rectangular parallelopiped-shaped portion of an upper bit line within a unit cell area), a dielectric pillar 40, and a top electrode 60 may be formed.

Referring to FIGS. 21A-21C, the processing steps of FIGS. 7A-7C may be performed to form a continuous active layer 30L and a gate dielectric layer 50L. In this embodiment, the horizontally-extending portion of the continuous active layer 30L may have a bottom surface above the horizontal plane including the bottom surfaces of the bottom electrodes 20.

Referring to FIGS. 22A-22C, the processing steps of FIGS. 8A-8C, 9A-9C, 10A-10C, 11A-11C, 12A-12C, and 13A-13C may be performed to form gate dielectrics 50, active layers 30, dielectric wall structures 64, and gate electrodes 52. Subsequently, the processing sequence of FIGS. 14A-14C and 15A-15C may be performed, or the processing sequence of FIGS. 16A-16C, 17A-17C, and 18A-18C may be performed.

Referring to FIGS. 23A-23C, a portion of a memory array region 100 of a third exemplary structure according to the third embodiment of the present disclosure is illustrated. The illustrated portion includes a first region R1 (shown in the left side in FIG. 23A) in which the vertical thin film transistors of the first exemplary structure are subsequently formed, and a second region R2 (shown in the right side in FIG. 23B) in which vertical thin film transistors having a longer channel length are subsequently formed.

Generally, the processing steps of FIGS. 1, 2A-2C, and 3A-3C may be performed. Subsequently, a dielectric pillar material layer 40L, an optional first etch stop layer 42L, a first insulating matrix layer 44L, an optional additional etch stop layer (which is herein referred to as a second etch stop layer 46L), and an additional insulating matrix layer (which is herein referred to as a second insulating matrix layer 48L). For example, the third exemplary structure may be derived from the first exemplary structure of FIGS. 4A-4C by depositing the second etch stop layer 46L and the second insulating matrix layer 48L. The second etch stop layer 46L may have any material composition that may be used for the first etch stop layer 42L, and may have the same thickness range as the first etch stop layer 42L. The material composition of the second etch stop layer 46L may be the same as, or may be different from, the material composition of the first etch stop layer 42L. The second insulating matrix layer 48L may have any material composition that may be used for the first insulating matrix layer 44L, and may have the same thickness range as the first insulating matrix layer 44L. The material composition of the second insulating matrix layer 48L may be the same as, or may be different from, the material composition of the first insulating matrix layer 44L.

Referring to FIGS. 24A-24C, a photoresist layer (not shown) may be applied over the second insulating matrix layer 48L, and may be lithographically patterned to cover the second region R2 without covering the first region R1. At least one etch process (such as at least one wet etch process) may be performed to sequentially etch unmasked portions of the second insulating matrix layer 48L and the second etch stop layer 46L. A top surface of the first insulating matrix layer 44L is physically exposed in the first region R1. The photoresist layer may be removed, for example, by ashing. A top surface of the second insulating matrix layer 48L is physically exposed in the second region R2.

Referring to FIGS. 25A-25C, a photoresist layer (not shown) may be applied over the physically exposed top surfaces of the first insulating matrix layer 44L and the second insulating matrix layer 48L, and may be lithographically patterned to form arrays of openings such that each opening overlies a respective one of the bottom electrodes 20. According to an aspect of the present disclosure, the areas of the openings in the photoresist layer may be located entirely within the areas of the bottom electrodes 20. In this embodiment, the periphery of each opening in the photoresist layer may be laterally offset inward from the periphery of a top surface of a respective underlying bottom electrode 20. In one embodiment, the lateral offset distance between the periphery of each opening in the photoresist layer and the periphery of the top surface of the respective underlying bottom electrode 20 in a plan view may be in a range from 1% to 30%, such as from 2% to 20% and/or from 3% to 10%, of the maximum lateral dimension of the underlying bottom electrode 20. For example, the lateral offset distance between the periphery of each opening in the photoresist layer and the periphery of the top surface of the underlying bottom electrode 20 in the plan view may be in a range from 0.5 nm to 100 nm, such as from 2 nm to 20 nm, although lesser and greater lateral offset distances may also be used.

An anisotropic etch process may be performed using the patterned photoresist layer as an etch mask layer. The first etch stop layer 42L and the second etch stop layer 46L may be used as etch stop structures for the anisotropic etch process in the first region R1 and in the second region R2, respectively. In one embodiment, a first two-dimensional array of top electrode cavities may be formed in the first insulating matrix layer 44L in the first region R1 underneath a first two-dimensional array of openings in the photoresist layer, and a second two-dimensional array of top electrode cavities may be formed in the second insulating matrix layer 48L in the second region R2 underneath a second two-dimensional array of openings in the photoresist layer. Optionally, an additional etch process (which may be an isotropic etch process or an anisotropic etch process) may be performed to etch physically exposed portions of the first etch stop layer 42L and the second etch stop layer 46L from underneath top electrode cavities. The photoresist layer may be subsequently removed, for example, by ashing.

The top electrode cavities may be filled with at least one metallic fill material. In one embodiment, the at least one metallic fill material may include a combination of a metallic liner layer including a metallic barrier material and a metallic fill material layer including a metallic fill material. The metallic liner layer may include a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may include W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the first insulating matrix layer 44L in the first region R1, and to remove portions of the metallic liner layer and the metallic fill material layer that overlie the horizontal plane including the top surface of the second insulating matrix layer 48L in the second region R2. In one embodiment, areas around a stepped surface (i.e., a physically exposed sidewall) of the second insulating matrix layer 48L at the boundary between the first region R1 and the second region R2 may be free of top electrode cavities to avoid adverse effects of the CMP process that may occur in proximity to a stepped surface. Remaining portions of the at least one metallic material include top electrodes 60. Top surfaces of a first subset of the top electrodes 60 in the first region R1 may be coplanar with the top surface of the first insulating matrix layer 44L, and top surfaces of a second subset of the top electrodes 60 in the second region R2 may be coplanar with the top surface of the second insulating matrix layer 48L.

A first two-dimensional array of top electrodes 60 may be formed in the first insulating matrix layer 44L in the first region R1, and a second two-dimensional array of top electrodes 60 may be formed in the second insulating matrix layer 48L in the second region R2. Generally, a first subset of the top electrodes 60 may be formed in the first insulating matrix layer 44L, and a second subset of the top electrodes 60 may be formed in the second insulating matrix layer 48L. The lateral distance between the first region R1 and the second region R2 may be selected such that the planarization process used to form the top electrodes 60 is not significantly impeded by the height difference across the first region R1 and the second region R2. The height difference is the sum of the thicknesses of the second insulating matrix layer 48L and the second etch stop layer 46L.

Referring to FIGS. 26A-26C, the second insulating matrix layer 48L, the second etch stop layer 46L, the first insulating matrix layer 44L, the first etch stop layer 42L, and the dielectric pillar material layer 40L may be etched using the top electrodes 60 as an etch mask. The second insulating matrix layer 48L may be etched concurrently with etching of the portion of the first insulating matrix layer 44L located in the first region R1. The portion of the first insulating matrix layer 44L located in the second region R2 may be etched after etching the second insulating matrix layer 48L. Generally, the second insulating matrix layer 48L may be anisotropically etched prior to, and/or concurrently with, the first insulating matrix layer 44L.

Once annular peripheral segments of top surfaces of the bottom electrodes 20 in the first region R1 are physically exposed, the anisotropic etch process may be continued using the combination of the top electrodes 60 and physically exposed portions of the bottom electrodes 20 as an etch mask to recess the insulating layer 12. The anisotropic etch process may be continued until annular portions of the top surfaces are physically exposed for each of the bottom electrodes 20. The thickness of the insulating layer 12 may be selected such that the bit lines 10 are not physically exposed after the anisotropic etch process.

Each patterned remaining portion of the first insulating matrix layer 44L constitutes an upper dielectric pillar segment 44. Each patterned remaining portion of the first etch stop layer 42L constitutes an etch stop dielectric plate 42. Each patterned portion of the dielectric pillar material layer 40L in the second region R2 constitutes a lower dielectric pillar segment 40'. Each patterned portion of the dielectric pillar material layer 40L in the first region R1 constitutes a dielectric pillar 40, which is herein referred to as a first dielectric pillar 40. Each contiguous combination of a lower dielectric pillar segment 40', an optional etch stop dielectric plate 42, and an upper dielectric pillar segment 44 constitutes a second dielectric pillar 140.

Referring to FIGS. 27A-27C, the processing steps of FIGS. 7A-7C may be performed to form a continuous active layer 30L and a gate dielectric layer 50L. The processing steps of FIGS. 8A-8C, 9A-9C, 10A-10C, 11A-11C, 12A-12C, and 13A-13C may be performed thereafter to form gate dielectrics 50, active layers 30, dielectric wall structures 64, and gate electrodes 52. Subsequently, the processing sequence of FIGS. 14A-14C and 15A-15C may be performed, or the processing sequence of FIGS. 16A-16C, 17A-17C, and 18A-18C may be performed.

The third exemplary structure may be a semiconductor structure that includes: a first vertical field effect transistor located over a substrate 8 (in a first region R1) and including a first bottom electrode 20, a first dielectric pillar 40, and a first top electrode 60, a first active layer 30 vertically extending between the first bottom electrode 20 and the first top electrode 60 and over a sidewall of the first dielectric pillar 40, a first gate dielectric 50 contacting the first active layer 30, and a first gate electrode 52 contacting the first gate dielectric 50; and a second vertical field effect transistor located over the substrate 8 (in the second region R2) and including a second bottom electrode 20, a second dielectric pillar 140, and a second top electrode 60, a second active layer 30 vertically extending between the second bottom electrode 20 and the second top electrode 60 and over a sidewall of the second dielectric pillar 140, a second gate dielectric 50 contacting the second active layer 30, and a second gate electrode 52 contacting the second gate dielectric 50, wherein the second dielectric pillar 140 has a greater height than the first dielectric pillar 40.

In one embodiment, the second dielectric pillar 140 includes: a lower dielectric pillar segment 40' including a same material as, and having a same height as, the first dielectric pillar 40; and an upper dielectric pillar segment 44 overlying the lower dielectric pillar segment 40' and underlying the second top electrode 60.

In one embodiment, the second dielectric pillar 140 includes an etch stop dielectric plate 42 located between the lower dielectric pillar segment 40' and the upper dielectric pillar segment 44; and sidewalls of the lower dielectric pillar segment 40', sidewalls of the etch stop dielectric plate 42, and sidewalls of the upper dielectric pillar segment 44 are vertically coincident with one another. In one embodiment, the sidewalls of the second top electrode 60, the upper dielectric pillar segment 44, the etch stop dielectric plate 42, and the lower dielectric pillar segment 40' may be vertically coincident.

In one embodiment, the first active layer 30 contacts a peripheral portion of a top surface of the first top electrode 60 and contacts a peripheral portion of a top surface of the first bottom electrode 20; the first gate dielectric 50 laterally surrounds the first active layer 30; and the first gate electrode 52 laterally surrounds the first gate dielectric 50. In one embodiment, the second active layer 30 contacts a peripheral portion of a top surface of the second top electrode 60 and contacts a peripheral portion of a top surface of the second bottom electrode 20; the second gate dielectric 50 laterally surrounds the second active layer 30; and the second gate electrode 52 laterally surrounds the second gate dielectric 50.

In one embodiment, the third exemplary structure includes: a contact-level dielectric layer 70 overlying the first gate electrode 52, the second gate electrode 52, the first top electrode 60, and the second top electrode 60; a first top contact via structure 80 vertically extending through the contact-level dielectric layer 70 and contacting a top surface of the first gate electrode 52; and a second top contact via structure 80 vertically extending through the contact-level dielectric layer 70 and contacting a top surface of the second gate electrode 52.

Generally, the channel length in each vertical thin film transistor is defined by the height of the dielectric pillar, which may be a first dielectric pillar 40 or a second dielectric pillar 140. Thus, multiple vertical field effect transistors having different channel lengths may be formed on a same substrate 8. Further, multiple arrays of vertical field effect transistors having different channel lengths may be formed. For example, a first array of vertical field effect transistors having a first channel length may be formed in a first region R1 in the memory array region 100, and a second array of vertical field effect transistors having a second channel length that is different from the first channel length may be formed in a second region R2 in the memory array region 100. While the present disclosure is described using an embodiment in which two different channel lengths are enabled, embodiments are expressly contemplated herein in which three different channel lengths or four or more different channel lengths are enabled by providing multiple insulating matrix layers.

Referring to FIG. 28, an exemplary structure is illustrated after formation of a two-dimensional array of vertical field effect transistors 900 over the insulating matrix layer 635. Various additional metal interconnect structures (632, 638) may be formed through the insulating matrix layer 635 and various dielectric material portions/layers 630 that are formed at the level of the vertical field effect transistors 900. Additional interconnect-level dielectric material layer and additional metal interconnect structures may be subsequently formed. For example, a fourth interconnect-level dielectric material layer 640 embedding fourth metal line structures 648 and third metal via structures 642 may be formed. While the present disclosure is described using an embodiment in which four levels of metal line structures are used, embodiments are expressly contemplated herein in which a lesser or greater number of interconnect levels are used.

Referring to FIG. 29, a flowchart that illustrates the general processing steps for manufacturing the semiconductor devices of the present disclosure.

Referring to step 2910 and FIGS. 1-6C, 19A-20C, and 23A-26C, a plurality of vertical stacks {(20, 40, 60) and optionally (20, 140, 60)} may be formed over a substrate 8. Each of the vertical stacks {(20, 40, 60) and optionally (20, 140, 60)} includes, from bottom to top, a bottom electrode 20, a dielectric pillar (40 or 140), and a top electrode 60.

Referring to step 2920 and FIGS. 7A-7C, 21A-21C, and 27A-27C, a continuous active layer 30L may be formed over the plurality of vertical stacks {(20, 40, 60) and optionally (20, 140, 60)}.

Referring to step 2930 and FIGS. 7A-7C, 21A-21C, and 27A-27C, a gate dielectric layer 50L may be formed over the continuous active layer 30L.

Referring to step 2940 and FIGS. 8A-10C, 22A-22C, and 27A-27C, the continuous active layer 30L and the gate dielectric layer 50L may be patterned into a plurality of active layers 30 and a plurality of gate dielectrics 50. Each of the plurality of active layers 30 laterally surrounds a respective row of vertical stack {(20, 40, 60) and optionally (20, 140, 60)}, and each of the plurality of gate dielectrics 50 laterally surrounds a respective one of the active layers 30.

Referring to step 2950 FIGS. 11A-18B, 22A-22C, and 27A-27C, gate electrodes 52 may be formed over the plurality of gate dielectrics 50. Subsequently, a contact-level dielectric layer 70 may be formed over the gate electrodes 52, and top contact via structures 80 may be formed through the contact-level dielectric layer 70 on a top surface of a respective one of the top electrodes 60. The top contact via structures 80 may be electrically connected using an array of source lines if the vertical field effect transistors are used as a two-dimensional array of switching devices, or may be individually connected to a two-dimensional array of memory elements (such as capacitors in embodiments which form a DRAM array) if the vertical field effect transistors are used as access transistors for a two-dimensional array of memory elements.

Referring to all drawings and according to various embodiments of the present disclosure, a semiconductor structure is provided, which includes: a two-dimensional array of vertical stacks {(20, 40, 60) and/or (20, 140, 60)} located over a substrate 8, wherein each of the vertical stacks {(20, 40, 60) and/or (20, 140, 60)} includes, from bottom to top, a bottom electrode 20, a dielectric pillar (40 or 140), and a top electrode 60; active layers 30 may include a semiconducting metal oxide material and extending over sidewalls of a respective vertical stack {(20, 40, 60) and/or (20, 140, 60)}; gate dielectrics 50 extending over a respective one of the active layers 30; and gate electrodes 52 laterally surrounding, and overlying, a respective one of the gate dielectrics 50, laterally extending along the first horizontal direction hd1, and laterally spaced apart along the second horizontal direction hd2.

In one embodiment, within each of the vertical stacks {(20, 40, 60) and/or (20, 140, 60)}, a top periphery of the dielectric pillar (40 or 140) coincides with a bottom periphery of the top electrode 60, and a top periphery of the bottom electrode 20 is laterally offset outward from a bottom periphery of the dielectric pillar (40 or 140).

In one embodiment, each of the active layers 30 contacts peripheral portions (such as annular segments) of a top surface of a bottom electrode 20. In one embodiment, each of the active layers 30 contacts peripheral portions (such as annular segments) of a top surface of a top electrode 60.

In one embodiment, the semiconductor structure includes dielectric wall structures 64 laterally extending along the first horizontal direction hd1 between a respective neighboring pair of gate electrodes 52 selected from the gate electrodes 52 and vertically extending at least from a first horizontal plane including top surfaces of the top electrodes 60 to a second horizontal plane including top surfaces of the gate electrodes 52, such as from a surface of an insulating layer 12 that contacts bottom surfaces of the bottom electrodes 20 to the second horizontal plane.

In one embodiment, the semiconductor structure includes: a contact-level dielectric layer 70 overlying the gate electrodes 52, the vertical stacks {(20, 40, 60) and/or (20, 140, 60)}, and the active layers 30; and a two-dimensional array of top contact via structures 80 vertically extending through the contact-level dielectric layer 70 and contacting a respective one of the top electrodes 60 and electrically isolated from the gate electrodes 52 by a respective dielectric material portion (which may be a downward-protruding portion of the contact-level dielectric layer 70 or a capping dielectric plate 68) overlying the respective one of the top electrodes 60.

In one embodiment, the semiconductor structure includes: a two-dimensional array of bottom contact via structures 15 contacting a bottom surface of a respective one of the bottom electrodes 20; and bit lines 10 contacting a respective column of the bottom contact via structures 15 that are arranged along the second horizontal direction hd2.

In one embodiment, each column of the bottom electrodes 20 that are arranged along the second horizontal direction hd2 is merged into a respective contiguous metal line to provide upper bit lines that laterally extend along the second horizontal direction hd2; and the semiconductor structure includes lower bit lines 10 that laterally extend along the second horizontal direction hd1, underlie a respective one of the upper bit lines, and are electrically connected to the respective one of the upper bit lines by a respective column of bottom contact via structures 15.

In one embodiment, each of the active layers 30 includes a horizontally-extending portion and a tubular portion laterally surrounding, and contacting, a respective vertical stack {(20, 40, 60) and/or (20, 140, 60)}.

According to various aspects of the present disclosure, the vertical field effect transistors of the present disclosure provide device scaling without suffering from adverse effects of channel misalignment or lack of overlap between the channel and source/drain electrodes (which include the bottom electrodes and the top electrodes). The channels, which may include vertical portions of the active layers, and the gate dielectrics are defined without lithographic patterning in self-alignment to a pre-existing pattern of a two-dimensional array of vertical stacks of a bottom electrode, a dielectric pillar, and a top electrode. The channels are self-aligned to the top electrodes and to bottom electrodes, and the contact resistance between the channels and the top electrodes, and the contact resistance between the channels and the bottom electrodes may be low due to increased areal overlap between the channels and the top and bottom electrodes. The channel width is the inner circumference of the vertical channel, and thus, a higher on-current per unit area may be provided compared to prior art devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a two-dimensional array of vertical stacks located over a substrate, wherein each of the two-dimensional array of vertical stacks includes, from bottom to top, a bottom electrode, a dielectric pillar, and a top electrode;
   active layers comprising a semiconducting metal oxide material and extending over sidewalls of a respective one of the vertical stacks;
   gate dielectrics extending over a respective one of the active layers;
   gate electrodes laterally surrounding, and overlying, a respective one of the gate dielectrics, laterally extending along the first horizontal direction, and laterally spaced apart along the second horizontal direction; and
   a two-dimensional array of top contact via structures contacting a respective one of the top electrodes, and not in direct contact with any of the gate dielectrics.

2. The semiconductor structure of claim 1, wherein, within each of the two-dimensional array of vertical stacks, a top periphery of the dielectric pillar coincides with a bottom periphery of the top electrode, and a top periphery of the bottom electrode is laterally offset outward from a bottom periphery of the dielectric pillar.

3. The semiconductor structure of claim 1, wherein each of the active layers contacts top surfaces of a respective bottom electrodes.

4. The semiconductor structure of claim 1, wherein each of the active layers contacts peripheral portions of top surfaces of a respective top electrode.

5. The semiconductor structure of claim 1, further comprising dielectric wall structures laterally extending along the first horizontal direction between a respective neighboring pair of gate electrodes selected from the gate electrodes and vertically extending at least from a first horizontal plane including top surfaces of the top electrodes to a second horizontal plane including top surfaces of the gate electrodes.

6. The semiconductor structure of claim 1, further comprising: a contact-level dielectric layer overlying the gate electrodes, the vertical stacks, and the active layers, wherein the two-dimensional array of top contact via structures vertically extends through the contact-level dielectric layer and is electrically isolated from the gate electrodes by a respective dielectric material portion overlying the respective one of the top electrodes.

7. The semiconductor structure of claim 1, further comprising:
   a two-dimensional array of bottom contact via structures contacting a bottom surface of a respective one of the bottom electrodes; and
   bit lines contacting a respective column of the bottom contact via structures that are arranged along the second horizontal direction.

8. The semiconductor structure of claim 1, wherein:
   each column of the bottom electrodes that are arranged along the second horizontal direction is merged into a respective contiguous metal line to provide upper bit lines that laterally extend along the second horizontal direction; and
   the semiconductor structure comprises lower bit lines that laterally extend along the second horizontal direction, underlie a respective one of the upper bit lines, and are electrically connected to the respective one of the upper bit lines by a respective column of bottom contact via structures.

9. The semiconductor structure of claim 1, wherein each of the active layers comprises a horizontally-extending portion and a tubular portion laterally surrounding, and contacting, a respective vertical stack.

10. A semiconductor structure comprising:
    a two-dimensional array of vertical stacks located over a substrate, wherein each of the two-dimensional array of vertical stacks includes, from bottom to top, a bottom electrode, a dielectric pillar, and a top electrode;
    active layers extending over sidewalls of a respective one of the vertical stacks;
    gate dielectrics extending over a respective one of the active layers;
    gate electrodes laterally surrounding, and overlying, a respective one of the gate dielectrics; and
    a two-dimensional array of top contact via structures contacting a respective one of the top electrodes, and not in direct contact with any of the gate dielectrics.

11. The semiconductor structure of claim 10, wherein the active layers comprise a semiconducting metal oxide material.

12. The semiconductor structure of claim 10, wherein each of the gate electrodes laterally extends along the first horizontal direction and laterally surrounds a respective row of vertical stacks within the two-dimensional array of vertical stacks.

13. The semiconductor structure of claim 10, wherein each of the gate dielectrics laterally extends along the first horizontal direction and laterally surrounds a respective row of vertical stacks within the two-dimensional array of vertical stacks.

14. The semiconductor structure of claim 10, wherein, within each of the two-dimensional array of vertical stacks, a top periphery of the dielectric pillar coincides with a bottom periphery of the top electrode, and a top periphery of the bottom electrode is laterally offset outward from a bottom periphery of the dielectric pillar.

15. The semiconductor structure of claim 10, wherein each of the active layers contacts peripheral portions of top surfaces of a respective top electrode.

16. The semiconductor structure of claim 10, further comprising dielectric wall structures laterally extending along the first horizontal direction between a respective neighboring pair of gate electrodes selected from the gate electrodes and vertically extending at least from a first horizontal plane including top surfaces of the top electrodes to a second horizontal plane including top surfaces of the gate electrodes.

17. The semiconductor structure of claim 10, wherein:
    each of the top contact via structures vertically extends through an opening in a respective one of the gate dielectrics.

18. The semiconductor structure of claim 10, further comprising a contact-level dielectric layer overlying the gate electrodes, the vertical stacks, and the active layers, wherein the two-dimensional array of top contact via structures vertically extends through the contact-level dielectric layer and is electrically isolated from the gate electrodes by a respective dielectric material portion, and wherein the active layers comprise portions that protrude downward below a horizontal plane including horizontal interfaces between bottom surfaces of the bottom electrodes and an underlying insulating layer.

19. A semiconductor structure comprising:
    a two-dimensional array of vertical stacks located over a substrate, wherein each of the two-dimensional array of vertical stacks includes, from bottom to top, a bottom electrode, a dielectric pillar, and a top electrode;
    active layers extending over sidewalls of a respective one of the vertical stacks;
    gate dielectrics extending over a respective row of vertical stacks within the two-dimensional array of vertical stacks, each row of vertical stacks being arranged along a first horizontal direction;
    gate electrodes laterally surrounding vertically-extending portions of, and overlying horizontally-extending portions of, a respective one of the gate dielectrics; and
    a two-dimensional array of top contact via structures contacting a respective one of the top electrodes, and not in direct contact with any of the gate dielectrics.

20. The semiconductor structure of claim 19, further comprising:
    a contact-level dielectric layer overlying the gate electrodes, the vertical stacks, and the active layers, wherein the two-dimensional array of top contact via structures vertically extends through the contact-level dielectric layer and is electrically isolated from the gate electrodes by a respective dielectric material portion overlying the respective one of the top electrodes;
    a two-dimensional array of bottom contact via structures contacting a bottom surface of a respective one of the bottom electrodes; and
    bit lines contacting a respective column of the bottom contact via structures that are arranged along the second horizontal direction.

* * * * *